(12) United States Patent
Fukura et al.

(10) Patent No.: US 12,224,654 B2
(45) Date of Patent: Feb. 11, 2025

(54) PULSE RECEIVING CIRCUIT AND SIGNAL TRANSMISSION DEVICE

(71) Applicant: Rohm Co., Ltd., Kyoto (JP)

(72) Inventors: Tsuyoshi Fukura, Kyoto (JP); Daiki Yanagishima, Kyoto (JP); Akio Sasabe, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 248 days.

(21) Appl. No.: 17/917,661

(22) PCT Filed: Apr. 6, 2021

(86) PCT No.: PCT/JP2021/014584
§ 371 (c)(1),
(2) Date: Oct. 7, 2022

(87) PCT Pub. No.: WO2021/215237
PCT Pub. Date: Oct. 28, 2021

(65) Prior Publication Data
US 2023/0155470 A1     May 18, 2023

(30) Foreign Application Priority Data
Apr. 24, 2020   (JP) ................................. 2020-077779

(51) Int. Cl.
*H02M 1/08*     (2006.01)
*H02M 1/00*     (2006.01)
*H03K 19/0175*  (2006.01)

(52) U.S. Cl.
CPC ...... *H02M 1/0006* (2021.05); *H03K 19/0175* (2013.01); *H02M 1/08* (2013.01)

(58) Field of Classification Search
CPC ... H02M 1/0006; H02M 1/08; H03K 19/0175
See application file for complete search history.

(56) References Cited

U.S. PATENT DOCUMENTS

| | | | | |
|---|---|---|---|---|
| 2012/0212251 A1* | 8/2012 | Yanagishima | ....... | H03K 17/691 324/762.01 |
| 2014/0061643 A1* | 3/2014 | Kaeriyama | ........... | H01L 23/528 257/48 |

(Continued)

FOREIGN PATENT DOCUMENTS

| | | |
|---|---|---|
| JP | 2014053365 | 3/2014 |
| JP | 2016046723 | 4/2016 |

(Continued)

OTHER PUBLICATIONS

International Search Report in International Appln. No. PCT/JP2021/014584, dated Jul. 6, 2021, 5 pages (with English Translation).

*Primary Examiner* — Adolf D Berhane
(74) *Attorney, Agent, or Firm* — Fish & Richardson P.C.

(57) ABSTRACT

A pulse receiving circuit constituting a signal transmission device includes a first pulse detector that receives a differential input between a first reception pulse signal, i.e. an internal signal at a secondary winding of a first transformer and a second reception pulse signal, i.e. an internal signal at a secondary winding of a second transformer; a second pulse detector that receives the differential input between the first reception pulse signal and the second reception pulse signal with input polarity reversed to that of the first pulse detector; and a logic unit that generates a reception pulse signal based on output signals of the first and second pulse detectors, respectively.

10 Claims, 18 Drawing Sheets

(56) References Cited

U.S. PATENT DOCUMENTS

| | | | | |
|---|---|---|---|---|
| 2016/0056850 A1* | 2/2016 | Nagase | ............... | H03K 17/61 |
| | | | | 375/340 |
| 2017/0194959 A1* | 7/2017 | Yanagishima | ......... | G01R 31/27 |
| 2023/0300007 A1* | 9/2023 | Ishihara | ............... | H04L 25/026 |
| | | | | 375/258 |
| 2024/0096538 A1* | 3/2024 | Kitada | ................. | H01F 27/29 |
| 2024/0221992 A1* | 7/2024 | Kitada | ................. | H01F 27/363 |

FOREIGN PATENT DOCUMENTS

| | | |
|---|---|---|
| JP | 2017188903 | 10/2017 |
| JP | 2018011108 | 1/2018 |

* cited by examiner

PULSE RECEIVING CIRCUIT AND SIGNAL TRANSMISSION DEVICE

TECHNICAL FIELD

The invention disclosed in this specification relates to a pulse receiving circuit and a signal transmission device.

BACKGROUND ART

Conventionally, signal transmission devices that transmit pulse signals while electrically isolating between input and output are used in various applications (such as power supply devices and motor driving devices).

Note that as an example of a conventional technique related to the above description, there is Patent Document 1 filed by this applicant.

LIST OF CITATIONS

Patent Literature

Patent Document 1: JP-A-2018-011108

SUMMARY OF THE INVENTION

Technical Problem

However, conventional signal transmission devices have room for further improvement for process of reducing instant transient common mode noise that is superimposed on each of reception pulse signals input in parallel to a pulse receiving circuit on a secondary side.

In view of the above task found by the inventors of this application, it is an object of the invention disclosed in this specification to provide a signal transmission device and a pulse receiving circuit used in the device, which are less susceptible to common mode noise.

Means for Solving the Problem

A signal transmission device disclosed in this specification includes a first pulse detector arranged to receive a differential input between a first reception pulse signal at a secondary winding of a first transformer and a second reception pulse signal at a secondary winding of a second transformer, a second pulse detector arranged to receive the differential input between the first reception pulse signal and the second reception pulse signal with input polarity reversed to that of the first pulse detector, and a logic unit arranged to generate a reception pulse signal based on output signals of the first and second pulse detectors.

Advantageous Effects of the Invention

According to the invention disclosed in this specification, it is possible to provide a signal transmission device that is less susceptible to common mode noise.

DESCRIPTION OF EMBODIMENTS

<Signal Transmission Device (Application)>

Figure 1:
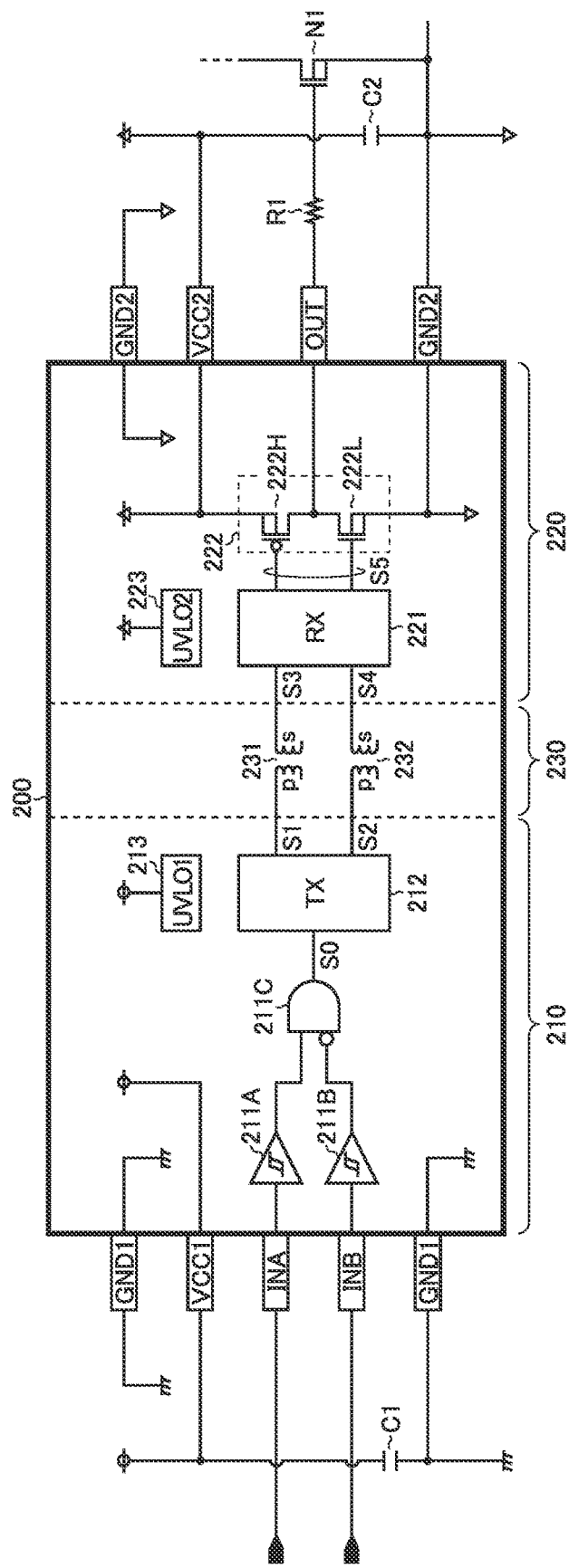
FIG. 1 is a diagram illustrating an application example of a signal transmission device.

FIG. 1 is a diagram illustrating an application example using a signal transmission device. A signal transmission device 200 of this structural example is a semiconductor integrated circuit device (a so-called isolated gate driver IC), which transmits a pulse signal from a primary circuit system (VCC1-GND1 system) to a secondary circuit system (VCC2-GND2 system), while electrically isolating between the primary circuit system and the secondary circuit system, so as to drive a gate of a transistor disposed in the secondary circuit system.

The signal transmission device 200 has a plurality of external terminals as means for establishing electrical connection to outside of the device (in this diagram, input terminals INA and INB, an output terminal OUT, power supply terminals VCC1 and VCC2, and ground terminals GND1 and GND2). These external terminals are connected externally to various discrete components (in this diagram, an N-channel type metal oxide semiconductor (MOS) field-effect transistor N1, capacitors C1 and C2, and a resistor R1).

On a first side (in this diagram, the left side) of a package of the signal transmission device 200, in order from top to bottom, there are arranged the ground terminal GND1, the power supply terminal VCC1, the input terminal INA, the input terminal INB, and the ground terminal GND1. In contrast, on a second side (the side opposite to the first side, or the right side in this diagram) of the same package, in order from top to bottom, there are arranged the ground terminal GND2, the power supply terminal VCC2, the output terminal OUT, and the ground terminal GND2.

In this way, it is preferred that the external terminals of the primary circuit system (GND1, VCC1, INA, and INB) are grouped on the first side of the package, while the external terminals of the secondary circuit system (GND2, VCC2, and OUT) are grouped on the second side of the package.

In addition, it is preferred that the ground terminals GND1 and the ground terminals GND2 are disposed on both ends of the first side and the second side of the package, respectively. In other words, it is preferred that there are two terminals for each of the ground terminals GND1 and GND2.

In outside of the signal transmission device 200 (the primary circuit system), the power supply terminal VCC1 is connected to a power supply line of the primary circuit system. The two ground terminals GND1 are both connected to a ground line of the primary circuit system. The capacitor C1 is connected between the power supply line and the ground line of the primary circuit system. The input terminals INA and INB are supplied with two input signals (e.g. a gate control signal and an enable signal), respectively.

In addition, in outside (the secondary circuit system) of the signal transmission device 200, the power supply terminal VCC2 is connected to a power supply line of the secondary circuit system. The two ground terminals GND2 are both connected to a ground line of the secondary circuit system. The capacitor C2 is connected between the power supply line and the ground line of the secondary circuit system. The output terminal OUT is connected to a first end of the resistor R1. A second end of a resistor R1 is connected to the gate of the transistor N1.

<Signal Transmission Device (Schematic Structure)>

Further, with reference to FIG. 1, a schematic structure of the signal transmission device 200 is described. The signal transmission device 200 of this structural example includes a controller chip 210 (corresponding to a first chip), a driver chip 220 (corresponding to a second chip), and a transformer chip 230 (corresponding to a third chip), which are sealed in a single package.

The controller chip 210 is a semiconductor chip that operates with a power supply voltage VCC1 (e.g. 7 V at maximum with respect to GND1). Note that the controller chip 210 includes, for example, Schmitt buffers 211A and 211B, an AND gate 211C, a pulse transmission circuit 212, and a low voltage protection circuit 213, which are integrated.

The Schmitt buffer 211A is an example of waveform shaping means and is connected between the input terminal INA and a first input terminal (a noninverting input terminal) of the AND gate 211C.

The Schmitt buffer 211B is an example of waveform shaping means and is connected between the input terminal INB and a second input terminal (an inverting input terminal) of the AND gate 211C.

The AND gate 211C performs AND operation between an input pulse signal INA and an inverted input pulse signal XINB (i.e. a logically inverted signal of the input pulse signal INB), so as to generate an input pulse signal S0, and outputs the same to the pulse transmission circuit 212. Therefore, if INB=H (a logic level when disabled) holds, S0=L (a fixed value) holds, and if INB=L (a logic level when enabled) holds, S0=INA holds.

The pulse transmission circuit 212 generates transmission pulse signals S1 and S2 in accordance with the input pulse signal S0. More specifically, when informing that the input pulse signal S0 is at high level, the pulse transmission circuit 212 performs pulse drive of the transmission pulse signal S1 (output of a single or a plurality of transmission pulses), and when informing that the input pulse signal S0 is at low level, it performs pulse drive of the transmission pulse signal S2. In other words, the pulse transmission circuit 212 performs pulse drive of either one of the transmission pulse signals S1 and S2 in accordance with the logic level of the input pulse signal S0.

The low voltage protection circuit 213 maintains the controller chip 210 in a stand-by state until the power supply voltage VCC1 reaches an under voltage lock out (UVLO) release voltage, so as to prevent a malfunction when inputting low voltage.

The driver chip 220 is a semiconductor chip that operates with a power supply voltage VCC2 (e.g. 30 V at maximum with respect to GND2). Note that a pulse receiving circuit 221, a driver 222, and a low voltage protection circuit 223 are integrated in the driver chip 220, for example.

The pulse receiving circuit 221 generates a reception pulse signal S5 in accordance with reception pulse signals S3 and S4 input from the transformer chip 230. More specifically, the pulse receiving circuit 221 lowers the reception pulse signal S5 to low level in response to pulse drive of the reception pulse signal S3, while it raises the reception pulse signal S5 to high level in response to pulse drive of the reception pulse signal S4. In other words, the pulse receiving circuit 221 changes the logic level of the reception pulse signal S5 in accordance with the logic level of the input pulse signal S0.

The driver 222 generates an output pulse signal OUT (corresponding to a gate signal of the transistor N1) in accordance with the reception pulse signal S5 input from the pulse receiving circuit 221. More specifically, when the reception pulse signal S5 is at low level, the driver 222 sets the output pulse signal OUT to high level, and when the reception pulse signal S5 is at high level, it sets the output pulse signal OUT to low level.

Note that as illustrated in this diagram, as the driver 222, it is possible to use a half bridge output stage (a CMOS (complementary MOS) inverter stage) consisting of a P-channel type MOS field-effect transistor 222H and an N-channel type MOS field-effect transistor 222L.

The connection relationship is described below. A source of the transistor 222H is connected to the power supply terminal VCC2. A source of the transistor 222L is connected to the ground terminal GND2. Drains of the transistors 222H and 222L are both connected to the output terminal OUT. The reception pulse signal S5 is input to gates of the transistors 222H and 222L. Therefore, when S5=L holds, the transistor 222H is turned on while the transistor 222L is turned off, and hence OUT=H (=VCC2) holds. In contrast, if S5=H holds, the transistor 222H is turned off while the transistor 222L is turned on, and hence OUT=L (=GND2) holds.

The low voltage protection circuit 223 maintains the driver chip 220 in the stand-by state until the power supply voltage VCC2 reaches the UVLO release voltage, so as to prevent a malfunction when inputting low voltage.

The transformer chip 230 uses the transformers 231 and 232 to galvanically isolate between the controller chip 210 and the driver chip 220, and outputs the transmission pulse signals S1 and S2 input from the pulse transmission circuit 212 to the pulse receiving circuit 221 as the reception pulse signals S3 and S4, respectively.

More specifically, in accordance with the transmission pulse signal S1 input to a primary winding 231p, the transformer 231 outputs the reception pulse signal S3 from a secondary winding 231s. In contrast, in accordance with the transmission pulse signal S2 input to a primary winding 232p, the transformer 232 outputs the reception pulse signal S4 from a secondary winding 232s.

In this way, due to characteristics of spiral coils used for insulation communication, the input pulse signal S0 is separated into the two transmission pulse signals S1 and S2 (corresponding to a rise signal and a fall signal), which are transmitted from the primary circuit system to the secondary circuit system via the transformers 231 and 232.

Note that the signal transmission device 200 of this structural example includes, besides the controller chip 210 and the driver chip 220, the transformer chip 230 in which only the transformers 231 and 232 are mounted, independently, and these three chips are sealed in a single package.

With this structure, the controller chip 210 and the driver chip 220 can be both manufactured in a usual low to medium withstand voltage process (of a few volts to a few tens volts), without necessity to use a dedicated high withstand voltage process (of a few kilovolts), and hence manufacturing cost can be reduced.

In addition, the controller chip 210 and the driver chip 220 can be both manufactured in an existing process with track record, without necessity to newly perform reliability test, and hence development period and development cost can be reduced.

In addition, when using a DC isolating element (such as a photocoupler) other than the transformer, it can be easily supported by replacing only the transformer chip 230, without necessity to redevelop the controller chip 210 and the driver chip 220, and hence development period and development cost can be reduced.

In the following description, noting the internal structure of the signal transmission device 200, more specific description is given.

Signal Transmission Device (First Embodiment)

Figure 2:
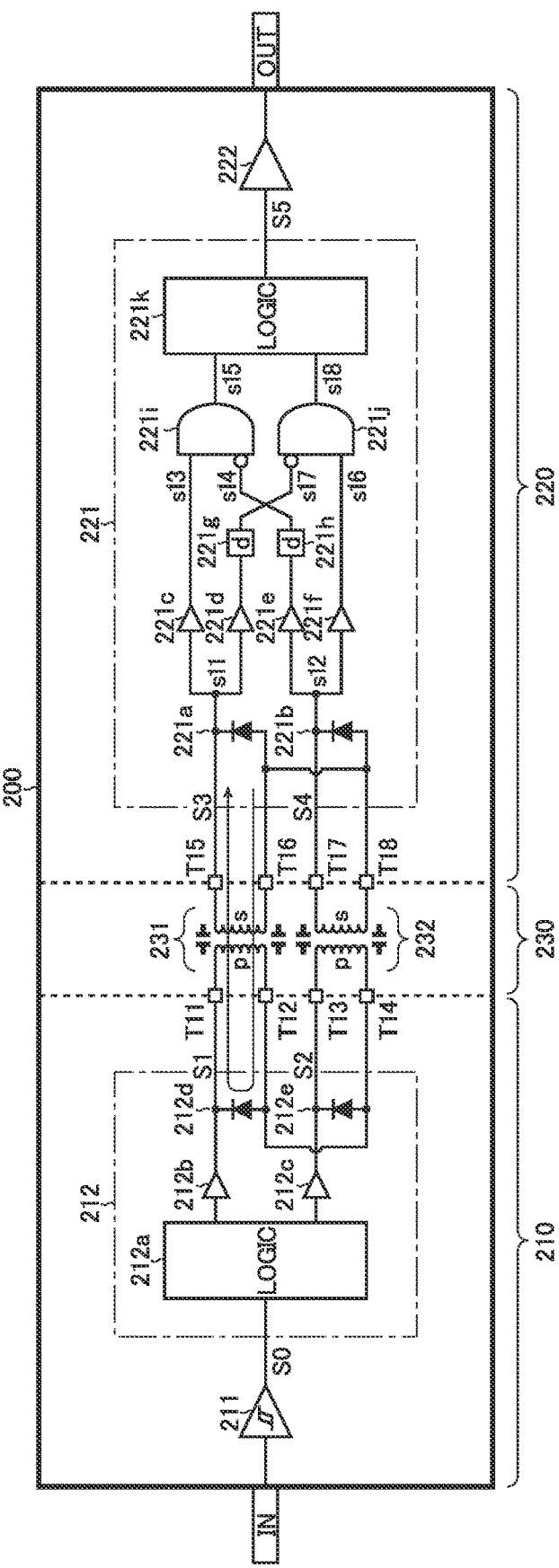
FIG. 2 is a diagram illustrating a first embodiment of the signal transmission device.

FIG. 2 is a diagram illustrating a first embodiment of the signal transmission device 200. In this diagram, on the basis of FIG. 1, circuit structures of the pulse transmission circuit 212 and the pulse receiving circuit 221 are specifically illustrated. The input terminals INA and INB described above are replaced by a single input terminal IN. The Schmitt buffers 211A and 211B and the AND gate 211C described above are replaced by a single Schmitt buffer 211. The transistors 222H and 222L described above are omitted in drawing.

In addition, the transformer chip 230 is explicitly provided with external terminals T11 to T18. The primary winding 231p of the transformer 231 is connected between the external terminal T11 and the external terminal T12. The primary winding 232p of the transformer 232 is connected between the external terminal T13 and the external terminal T14. The secondary winding 231s of the transformer 231 is connected between the external terminal T15 and the external terminal T16. The secondary winding 232s of the transformer 232 is connected between the external terminal T17 and the external terminal T18.

Note that due to structures of the transformers 231 and 232, parasitic capacitances are formed between the primary winding 231p and the secondary winding 231s, and between the primary winding 232p and the secondary winding 232s.

The pulse transmission circuit 212 includes a logic unit 212a, buffers 212b and 212c, and diodes 212d and 212e.

The logic unit 212a drives the buffers 212b and 212c in accordance with the input pulse signal S0 (consequently corresponding to an input pulse signal IN). More specifically, when informing that the input pulse signal S0 is at high level, the logic unit 212a drives the buffer 212b, and when informing that the input pulse signal S0 is at low level, it drives the buffer 212c.

The buffer 212b is driven by the logic unit 212a so as to generate the transmission pulse signal S1, and outputs the same to the external terminal T11 of the transformer chip 230.

The buffer 212c is driven by the logic unit 212a so as to generate the transmission pulse signal S2, and outputs the same to the external terminal T13 of the transformer chip 230.

The diode 212d is an example of an electrostatic protection element, which has a cathode connected to the external terminal T11 of the transformer chip 230 and an anode connected to the external terminals T12 and T14 of the transformer chip 230.

The diode 212e is an example of an electrostatic protection element, which has a cathode connected to the external terminal T13 of the transformer chip 230 and an anode connected to the external terminals T12 and T14 of the transformer chip 230.

The pulse receiving circuit 221 includes diodes 221a and 221b, buffers 221c to 221f, delay units 221g and 221h, AND gates 221i and 221j, and a logic unit 221k.

The diode 221a has a cathode connected to the external terminal T15 of the transformer chip 230. The diode 221a has an anode connected to the external terminals T16 and T18 of the transformer chip 230. The diode 221a connected in this way functions as an electrostatic protection element connected between both ends of the secondary winding 231s constituting the transformer 231.

The diode 221b has a cathode connected to the external terminal T17 of the transformer chip 230. The diode 221b has an anode connected to the external terminals T16 and T18 of the transformer chip 230. The diode 221b connected in this way functions as an electrostatic protection element connected between both ends of the secondary winding 232s constituting the transformer 232.

The buffers 221c and 221d are waveform forming means for the reception pulse signal S3 (i.e. an internal signal s11). More specifically, the buffers 221c and 221d raise the output signal to high level when the internal signal s11 is higher than a threshold value voltage Vth, and lower the output signal to low level when the internal signal s11 is lower than the threshold value voltage Vth, for example. Note that the output signal of the buffer 221c is output as an internal signal s13 (i.e. a main signal) to the AND gate 221i.

The buffers 221e and 221f are waveform forming means for the reception pulse signal S4 (i.e. an internal signal s12). More specifically, the buffers 221e and 221f raise the output signal to high level when the internal signal s12 is higher than the threshold value voltage Vth, and lower the output signal to low level when the internal signal s12 is lower than the threshold value voltage Vth, for example. Note that the output signal of the buffer 221f is output as an internal signal s16 (i.e. a main signal) to the AND gate 221j.

When the output signal of the buffer 221d is raised to high level, for example, the delay unit 221g raises an internal signal s17 (i.e. a mask signal) to high level without delay, and thereafter when a predetermined masking time tm1 elapses, it lowers the internal signal s17 to low level.

When the output signal of the buffer 221e is raised to high level, for example, the delay unit 221h raises an internal signal s14 (i.e. a mask signal) to high level without delay, and thereafter when the predetermined masking time tm1 elapses, it lowers the internal signal s14 to low level.

The AND gate 221i performs AND operation between the internal signal s13 to be a noninverting input and the internal signal s14 to be an inverting input, so as to generate an internal signal s15. Therefore, if s14=H (a logic level when masking) holds, s15=L (a fixed value) holds, and if s14=L (a logic level when masking is released) holds, s15=s13 holds. Note that the internal signal s15 corresponds to a set signal of the logic unit 221k, for example.

The AND gate 221j performs AND operation between the internal signal s16 to be a noninverting input and the internal signal s17 to be an inverting input, so as to generate an internal signal s18. Therefore, if s17=H (a logic level when masking) holds, s18=L (a fixed value) holds, and if s17=L (a logic level when masking is released) holds, s18=s16 holds. Note that the internal signal s15 corresponds to a reset signal of the logic unit 221k, for example.

The logic unit 221k generates the reception pulse signal S5 (consequently the output pulse signal OUT) based on the internal signals s15 and s18. Specifically, when the internal signal s15 rises to high level, the logic unit 221k sets the reception pulse signal S5 to high level, and when the internal signal s18 rises to high level, it resets the reception pulse signal S5 to low level, for example.

Note that among the components of the pulse receiving circuit 221 described above, the buffers 221c to 221f, the delay units 221g and 221h, and the AND gates 221i and 221j function as a noise canceler for reducing common mode noise superimposed on the reception pulse signals S3 and S4 via propagation path shown by thin arrow line in the diagram.

Figure 3:
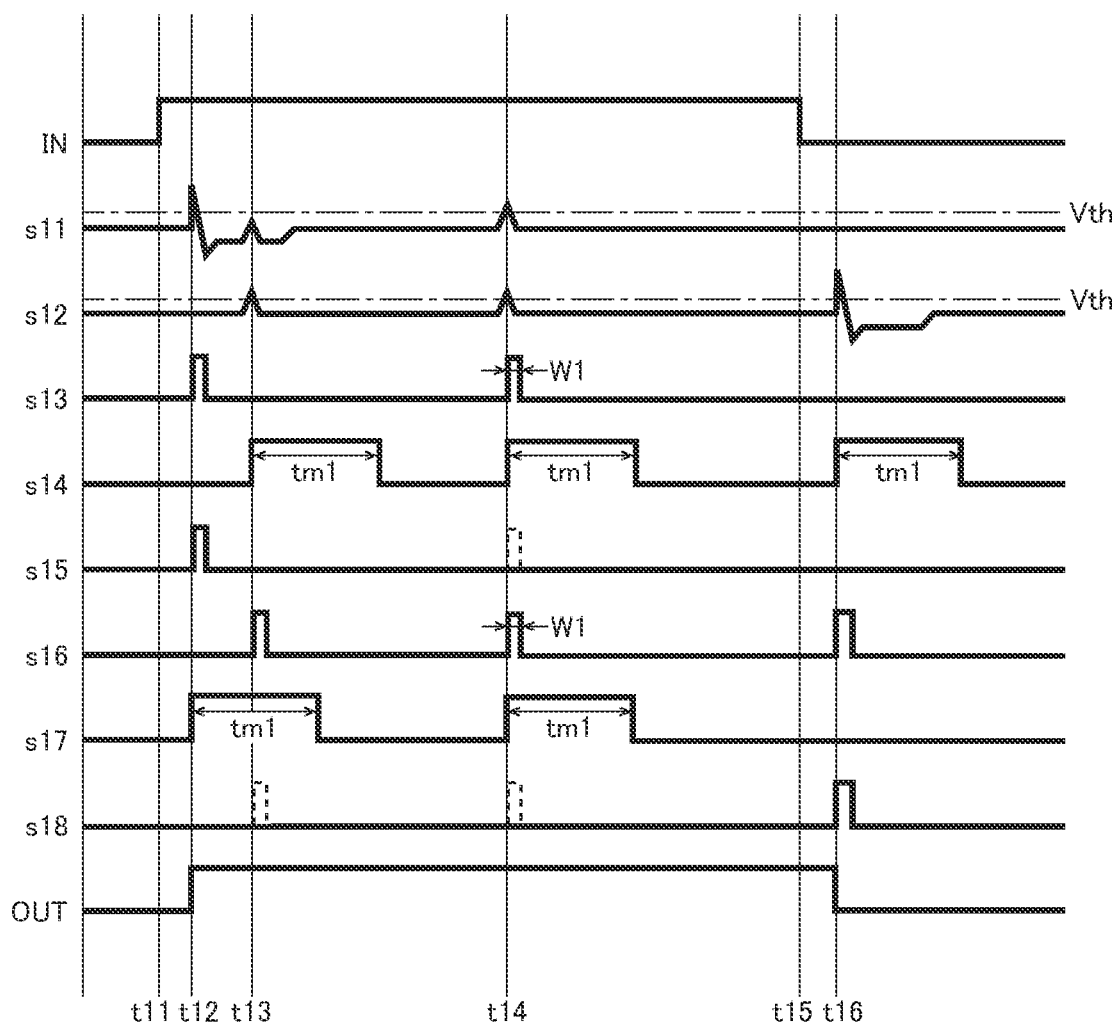
FIG. 3 is a diagram illustrating an example of a noise reduction operation in the first embodiment.

FIG. 3 is a diagram illustrating an example of a noise reduction operation in the first embodiment, in which the input pulse signal IN, the internal signals s11 to s18, and the output pulse signal OUT are shown in order from top to bottom.

First, rising of the input pulse signal IN is considered. For instance, when the input pulse signal IN is raised to high level at time t11, the transmission pulse signal S1 (not shown) is pulse-driven. Therefore, at next time t12, a normal pulse rises in the reception pulse signal S3 (i.e. the internal signal s11) via the transformer 231, to be higher than the threshold value voltage Vth of the buffers 221c and 221d. As a result, pulses are generated in the internal signals s13 and s17, respectively. In contrast, at time t12, a pulse does not rise in the reception pulse signal S4 (i.e. the internal signal s12), and hence the internal signals s14 and s16 are maintained at low level.

Note that when the internal signal s14 (i.e. a mask signal) is at low level, the internal signal s13 (i.e. a main signal) is not masked but is output as it is as the internal signal s15 (i.e. a set signal). As a result, at time t12, the output pulse signal OUT is set to high level.

In addition, when the internal signal s17 (i.e. a mask signal) is at high level, the internal signal s18 (i.e. a reset signal) is fixed to low level regardless of the logic level of the internal signal s16 (i.e. a main signal). However, at time t12, the internal signal s18 should be naturally maintained at low level, and hence there is no mismatch.

Next, falling of the input pulse signal IN is considered. For instance, when the input pulse signal IN is lowered to low level at time t15, the transmission pulse signal S2 (not shown) is pulse-driven. Therefore, at next time t16, a normal pulse rises in the reception pulse signal S4 (i.e. the internal signal s12) via the transformer 232, to be higher than the threshold value voltage Vth of the buffers 221e and 221f. As a result, pulses are generated in the internal signals s14 and s16, respectively. In contrast, at time t16, a pulse does not rise in the reception pulse signal S3 (i.e. the internal signal s11), and hence the internal signals s13 and s17 are maintained at low level.

Note that when the internal signal s17 (i.e. a mask signal) is at low level, the internal signal s16 (i.e. a main signal) is not masked but is output as it is as the internal signal s18 (i.e. a reset signal). As a result, at time t16, the output pulse signal OUT is reset to low level.

In addition, when the internal signal s14 (i.e. a mask signal) is at high level, the internal signal s15 (i.e. a set signal) is fixed to low level regardless of the logic level of the internal signal s13 (i.e. a main signal). However, at time t16, the internal signal s15 should be naturally maintained at low level, and hence there is no mismatch.

Further, consider a case where common mode noise is superimposed on each of the reception pulse signals S3 and S4 (i.e. the internal signals s11 and s12). For instance, at time t14, a noise pulse rises in each of the internal signals s11 and s12, to be higher than the threshold value voltage Vth of the buffers 221c to 221f, and then pulses are generated in the internal signals s13 and s16 (i.e. main signals) and the internal signals s14 and s17 (i.e. mask signals), respectively.

Here, when the internal signal s14 (i.e. a mask signal) is at high level, the internal signal s15 (i.e. a set signal) is fixed to low level regardless of the logic level of the internal signal s13 (i.e. a main signal). Similarly, when the internal signal s17 (i.e. a mask signal) is at high level, the internal signal s18 (i.e. a reset signal) is fixed to low level regardless of the logic level of the internal signal s16 (i.e. a main signal). Therefore, common mode noise superimposed on each of the reception pulse signals S3 and S4 (i.e. the internal signals s11 and s12) can be appropriately reduced, and hence switching error of the logic level of the output pulse signal OUT can be suppressed.

Note that in order to securely reduce common mode noise, it is preferred that the masking time tm1 of the internal signals s14 and s17 (i.e. mask signals) is more than a pulse width W1 of the internal signals s13 and s16 (i.e. main signals) due to superimposed noise, and that the masking time tm1 completely overlaps the pulse width W1.

In other words, it is preferred to appropriately design the buffers 221c to 221f and the delay units 221g and 221h, so that the internal signals s13 and s16 (i.e. main signals) rise to high level after the internal signals s14 and s17 (i.e. mask signals) rise to high level, and that the internal signals s14 and s17 (i.e. mask signals) fall to low level after the internal signals s13 and s16 (i.e. main signals) fall to low level.

In addition, during pulse driving of the internal signals s11 and s12 (i.e. during receiving the normal pulse), regenerative current flowing in the transformers 231 and 232 causes the internal signals s11 and s12 to be a negative potential (i.e. a lower potential than normal low level) in a certain period. During this negative potential period, if common mode noise is superimposed, a state may occur where only one of the internal signals s11 and s12 is higher than the threshold value voltage Vth of the buffers 221c to 221f.

For instance, at time t13, when common mode noise is superimposed on the internal signal s11 during the negative potential period, only the internal signal s12 out of the internal signals s11 and s12 is higher than the threshold value voltage Vth, and pulses are generated in the internal signals s14 and s16. In contrast, the internal signal s11 is not higher than the threshold value voltage Vth, and hence a trigger does not occur that raises again the internal signal s17 (i.e. a mask signal) to high level.

Therefore, in order to remove the pulse due to noise generated in the internal signal s16, it is necessary to maintain the internal signal s17 (i.e. a mask signal) at high level, which has already been high level due to the normal pulse of the internal signal s11.

In particular, by setting the high level period of the internal signal s17 (i.e. the masking time tm1) to be longer than the negative potential period of the internal signal s11, the pulse due to noise generated in the internal signal s16 can be appropriately removed, even in a worst case where common mode noise is superimposed just before end of the negative potential period.

Note that although overlapping description is omitted, it is needless to say that the above description is true also in a case where common mode noise is superimposed on the internal signal s12 during the negative potential period.

<Problem of First Embodiment>

Now, in the pulse receiving circuit 221 of the first embodiment, the buffers 221c to 221f constituted of CMOS circuits have the threshold value voltages Vth that are high, and hence high energy is necessary to transmit a signal. Therefore, emission noise and power consumption are increased. In addition, if the threshold value voltages Vth of the buffers 221c to 221f are simply lowered, malfunction due to noise may easily occur. Therefore, the following description proposes a novel second embodiment that can solve the above-mentioned problem.

Signal Transmission Device (Second Embodiment)

Figure 4:
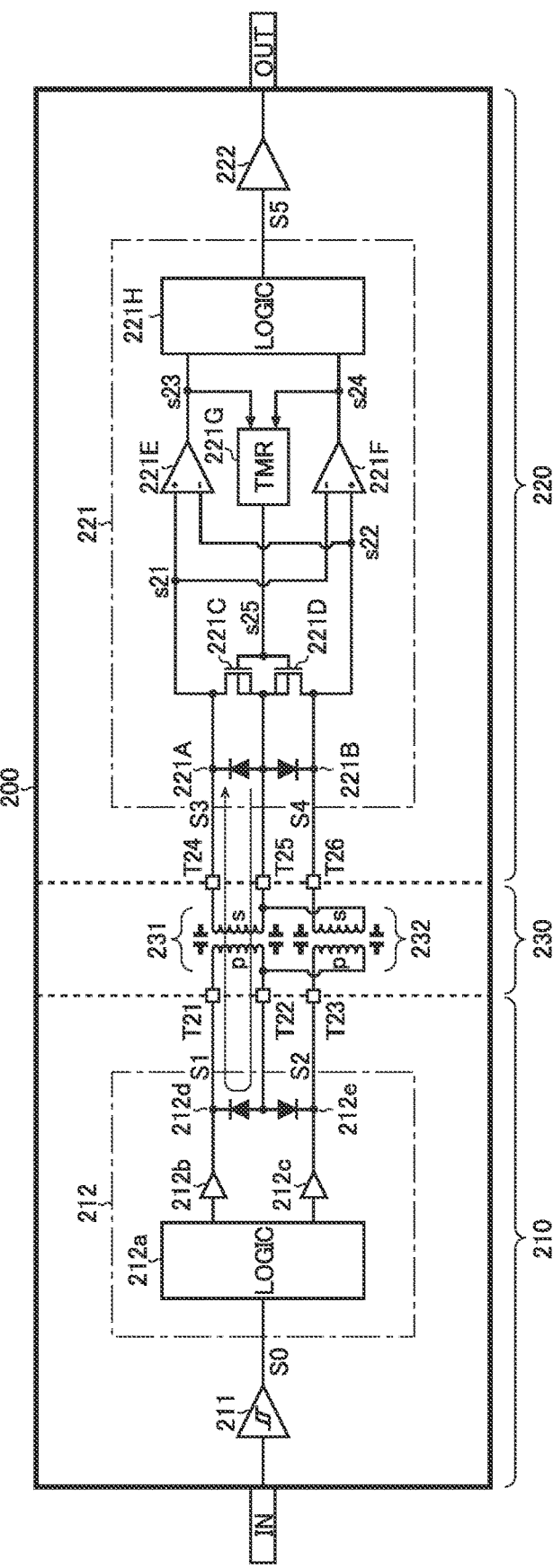
FIG. 4 is a diagram illustrating a second embodiment of the signal transmission device.

FIG. 4 is a diagram illustrating the second embodiment of the signal transmission device 200. In this diagram, on the basis of FIGS. 1 and 2, the circuit structure of the pulse receiving circuit 221 is modified. In addition, the number of the external terminals of the transformer chip 230 is decreased from 8 to 6 (i.e. external terminals T21 to T26). In the following description, the modified points are described in detail.

First, the modified point of the pulse receiving circuit 221 is described. The pulse receiving circuit 221 of this embodiment includes diodes 221A and 221B, N-channel type MOS field-effect transistors 221C and 221D, comparators 221E and 221F, a timer 221G, and a logic unit 221H.

The diode 221A has a cathode connected to the external terminal T24 of the transformer chip 230. The diode 221A has an anode connected to the external terminal T25 of the transformer chip 230. The diode 221A connected in this way functions as a first electrostatic protection element connected between both ends of the secondary winding 231s constituting the transformer 231.

The diode 221B has a cathode connected to the external terminal T26 of the transformer chip 230. The diode 221B has an anode connected to the external terminal T25 of the transformer chip 230. The diode 221B connected in this way functions as a second electrostatic protection element connected between both ends of the secondary winding 232s constituting the transformer 232.

The transistor 221C has a drain connected to the external terminal T24 of the transformer chip 230. The transistor 221C has a source connected to the external terminal T25 of the transformer chip 230. The transistor 221C has a gate connected to an application terminal of an internal signal s25 (i.e. an output terminal of the timer 221G). Therefore, if s25=H holds, the transistor 221C is turned on, and if s25=L holds, it is turned off. The transistor 221C connected in this way functions as a first switch connected between both ends of the secondary winding 231s constituting the transformer 231.

The transistor 221D has a drain connected to the external terminal T26 of the transformer chip 230. The transistor 221D has a source connected to the external terminal T25 of the transformer chip 230. The transistor 221D has a gate connected to an application terminal of the internal signal s25 (i.e. the output terminal of the timer 221G). Therefore, if s25=H holds, the transistor 221D is turned on, and if s25=L holds, it is turned off. The transistor 221D connected in this way functions as a second switch connected between both ends of the secondary winding 232s constituting the transformer 232.

The comparator 221E has a noninverting input terminal (+) that is connected to the external terminal T24 of the transformer chip 230. The comparator 221E has an inverting input terminal (−) that is connected to the external terminal T26 of the transformer chip 230. The comparator 221E connected in this way corresponds to a first pulse detector, which receives the reception pulse signal S3 at the secondary winding 231s of the transformer 231 (i.e. an internal signal s21) and the reception pulse signal S4 at the secondary winding 232s of the transformer 232 (i.e. an internal signal s22) as a differential input (i.e. s21-s22) and compares the signals, so as to generate an internal signal s23. Note that the internal signal s23 corresponds to a set signal of the logic unit 221H, for example, and it is high level if s21>s22 holds, while it is low level if s21<s22 holds.

The comparator 221F has a noninverting input terminal (+) that is connected to the external terminal T26 of the transformer chip 230. The comparator 221F has an inverting input terminal (−) that is connected to the external terminal T24 of the transformer chip 230. The comparator 221F connected in this way corresponds to a second pulse detector, which receives the reception pulse signals S3 and S4 (i.e. internal signals s21 and s22) as a differential input with input polarity reversed to that of the comparator 221E and compares the signals, so as to generate an internal signal s24. Note that the internal signal s24 corresponds to a reset signal of the logic unit 221H, for example, and it is low level if s21>s22 holds, while it is high level if s21<s22 holds.

The timer 221G receives inputs of the internal signals s23 and s24, and sets the internal signal s25 to high level from timing when each signal rises to high level (corresponding to pulse detection timing of each of the first pulse detector and the second pulse detector) for a predetermined masking time tm2, so as to turn on the transistors 221C and 221D.

The logic unit 221H generates the reception pulse signal S5 (consequently the output pulse signal OUT) based on the internal signals s23 and s24. Specifically, the logic unit 221H sets the reception pulse signal S5 to high level when the internal signal s23 rises to high level, and it resets the reception pulse signal S5 to low level when the internal signal s24 rises to high level, for example.

Figure 5:
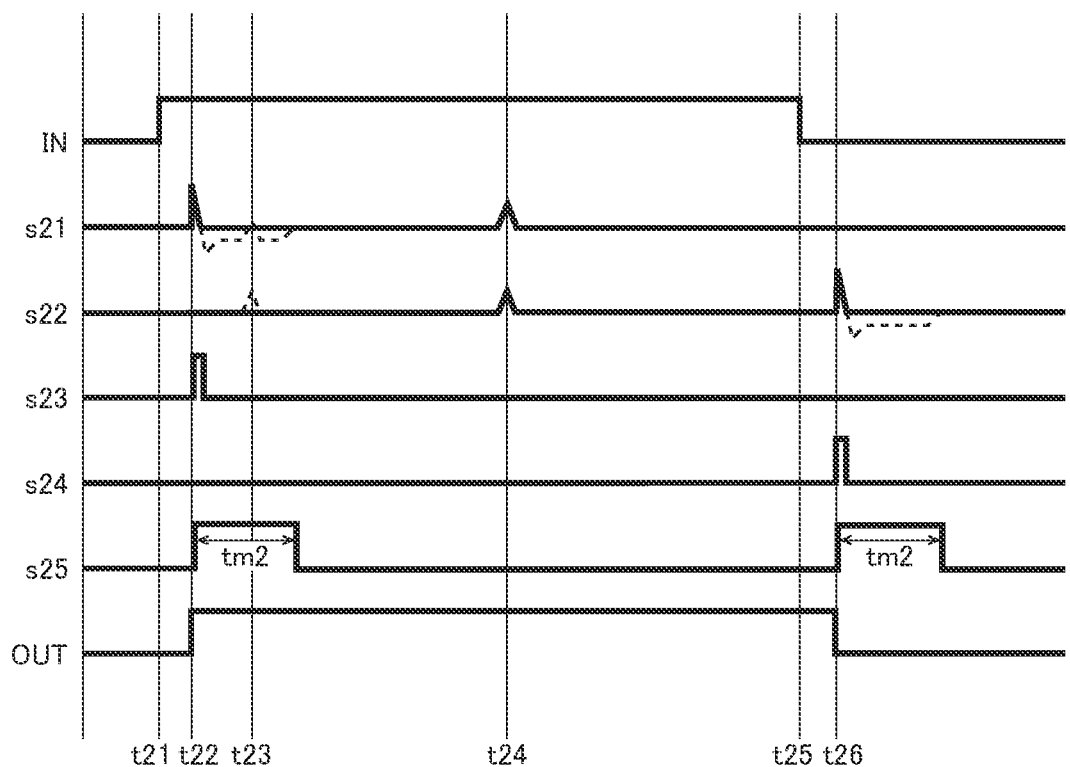
FIG. 5 is a diagram illustrating an example of the noise reduction operation in the second embodiment.

FIG. 5 is a diagram illustrating an example of the noise reduction operation in the second embodiment, in which the input pulse signal IN, the internal signals s21 to s25, and the output pulse signal OUT are shown in order from top to bottom.

First, rising of the input pulse signal IN is considered. For instance, when the input pulse signal IN is raised to high level at time t21, the transmission pulse signal S1 (not shown) is pulse-driven. Therefore, at next time t22, a normal pulse rises in the reception pulse signal S3 (i.e. the internal signal s21) via the transformer 231. In contrast, at time t22, a pulse does not rise in the reception pulse signal S4 (i.e. the internal signal s12). Therefore, a pulse is generated in the internal signal s23, while the internal signal s24 is maintained at low level. As a result, at time t22, the output pulse signal OUT is set to high level.

Next, falling of the input pulse signal IN is considered. For instance, when the input pulse signal IN is lowered to low level at time t25, the transmission pulse signal S2 (not shown) is pulse-driven. Therefore, at next time t26, a normal pulse rises in the reception pulse signal S4 (i.e. the internal signal s22) via the transformer 232. In contrast, at time t26, a pulse does not rise in the reception pulse signal S3 (i.e. the internal signal s21). Therefore, a pulse is generated in the internal signal s24, while the internal signal s23 is maintained at low level. As a result, at time t26, the output pulse signal OUT is reset to low level.

Further, consider a case where common mode noise is superimposed on each of the reception pulse signals S3 and S4 (i.e. the internal signals s21 and s22). For instance, at time t24, noise pulses rise in both the internal signals s21 and s22. However, these noise pulses are differentially input to the comparators 221E and 221F, respectively, in phase. Therefore, an unintended pulse is hardly generated in the internal signals s23 and s24, and hence switching error of the logic level of the output pulse signal OUT can be suppressed.

In addition, with the structure in which the internal signals s21 and s22 are differentially detected, compared with the first embodiment (FIG. 2) described above, the threshold value voltage Vth of the pulse receiving circuit 221 (in this diagram, input offset voltages Vofs1 and Vofs2 of the comparators 221E and 221F, respectively) can be set to small value, and hence common mode noise can be reduced while suppressing emission noise and power consumption.

In addition, during pulse drive of the internal signals s21 and s22 (i.e. during receiving the normal pulse), the regenerative current flowing in the transformers 231 and 232 causes the internal signals s21 and s22 to be a negative potential in a certain period (see broken lines of the internal signals s21 and s22). When this negative potential period is generated, unnecessary pulses can be generated in the internal signals s23 and s24 generated in the comparators 221E and 221F, resulting in misdetection of the reception pulse signal S5 (consequently the output pulse signal OUT).

Therefore, when a pulse is detected in the internal signal s23 or s24 at time t22 or time t26, the internal signal s25 is set to high level for a predetermined masking time tm2. In this way, the transistors 221C and 221D are turned on, and both terminals of the secondary windings 231s and 232s are short-circuited, and differential input of each of the comparators 221E and 221F becomes zero. As a result, generation of unnecessary pulses in the internal signals s23 and s24 can be suppressed.

Note that it is preferred to set the high level period (i.e. the masking time tm2) of the internal signal s25 to be longer than the negative potential period of the internal signals s21 and s22.

Figure 6:
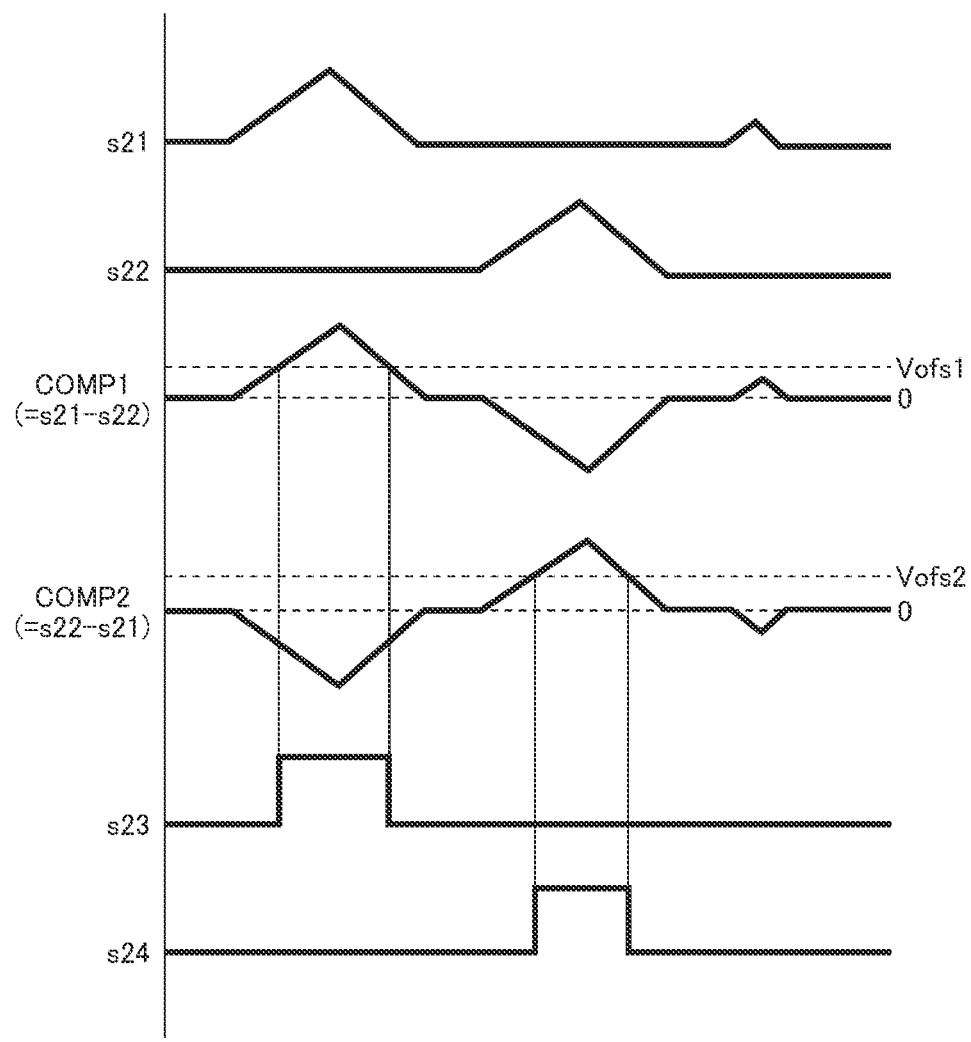
FIG. 6 is a diagram illustrating a comparison operation example of a comparator.

FIG. 6 is a diagram illustrating a comparison operation example of the comparators 221E and 221F, in which the internal signals s21 and s22 (i.e. the reception pulse signals S3 and S4), a differential input signal COMP1 (i.e. s21-s22) to the comparator 221E, a differential input signal COMP2 (i.e. s22-s21) to the comparator 221F, and the internal signals s23 and s24 (i.e. comparison output signals of the comparators 221E and 221F) are shown in order from top to bottom.

As illustrated in this diagram, circuits of the comparators 221E and 221F are designed to have input offset voltages Vofs1 and Vofs2, respectively. In other words, the internal signal s23 is high level if COMP1>Vofs1 holds, while it is low level if COMP1<Vofs1 holds. In addition, the internal signal s24 is high level if COMP2>Vofs2 holds, while it is low level if COMP2<Vofs2 holds.

Therefore, even if the internal signals s21 and s22 vary a little, as long as the differential input signals COMP1 and COMP2 are not higher than the input offset voltages Vofs1 and Vofs2, respectively, unnecessary pulses are not generated in the internal signals s23 and s24. Therefore, misdetection of the output pulse signal OUT (unintended switching of logic level) can be suppressed.

<Transformer Chip>

Next, with reference to FIG. 4 again, a modified point of the transformer chip 230 in the second embodiment is described. In the transformer chip 230 of this embodiment, the number of the external terminals is reduced from eight to six (i.e. the external terminals T21 to T26), compared to the first embodiment (FIG. 2).

The primary winding 231p of the transformer 231 is connected between the external terminal T21 and the external terminal T22. The primary winding 232p of the transformer 232 is connected between the external terminal T23 and the external terminal T22. The secondary winding 231s of the transformer 231 is connected between the external terminal T24 and the external terminal T25. The secondary winding 232s of the transformer 232 is connected between the external terminal T26 and the external terminal T25.

In this way, the transformer chip 230 includes the external terminal T21 connected to a first terminal of the primary winding 231p, the external terminal T22 connected to a second terminal of the primary winding 231p and a first terminal of the primary winding 232p, the external terminal T23 connected a second terminal of the primary winding 232p, the external terminal T24 connected to a first terminal of the secondary winding 231s, the external terminal T25 connected to a second terminal of the secondary winding 231s and the first terminal of the secondary winding 232s, and the external terminal T26 connected to a second terminal of the secondary winding 232s.

Figure 7:
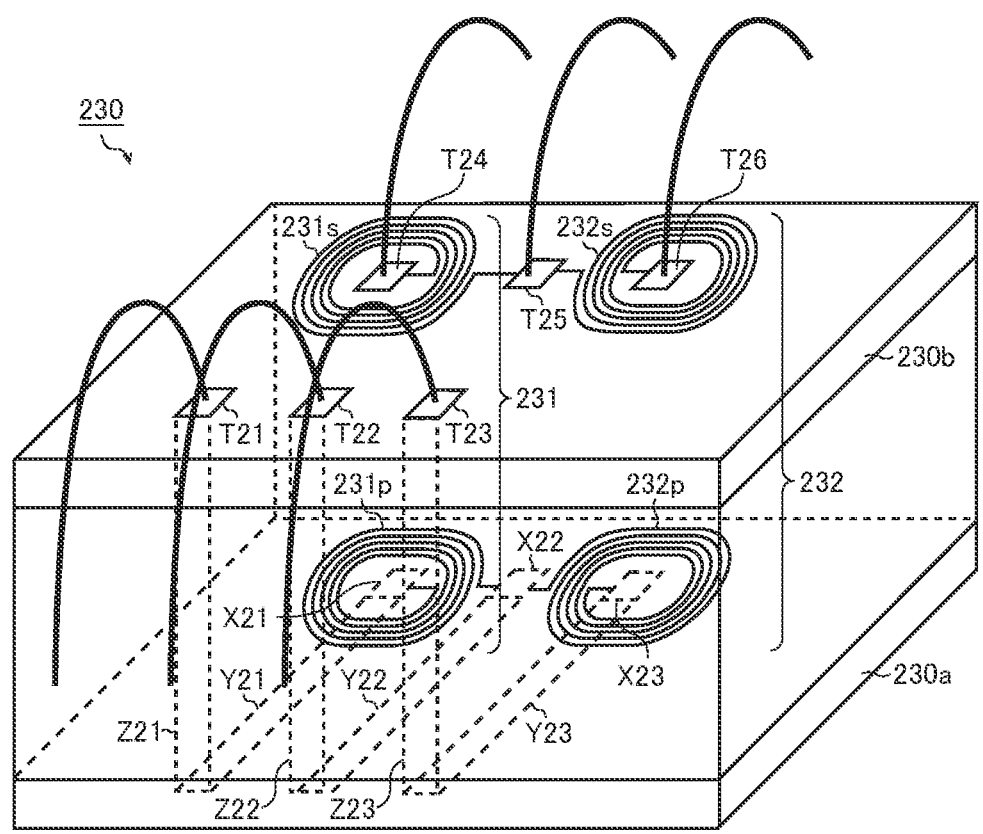
FIG. 7 is a diagram illustrating a structure example of a transformer chip in the second embodiment.

FIG. 7 is a diagram illustrating a structure example of the transformer chip 230 according to the second embodiment. In the transformer chip 230 of this structure example, the transformer 231 includes the primary winding 231p and the secondary winding 231s facing each other in the up and down direction. In addition, the transformer 232 includes the primary winding 232p and the secondary winding 232s facing each other in the up and down direction.

The primary windings 231p and 232p are formed in a first layer (lower layer) 230a of the transformer chip 230, while the secondary windings 231s and 232s are formed in a second layer (upper layer) 230b of the transformer chip 230. Note that the secondary winding 231s is disposed just above the primary winding 231p so as to face the primary winding 231p. In addition, the secondary winding 232s is disposed just above the primary winding 232p so as to face the primary winding 232p.

The primary winding 231p is formed in a spiral shape starting at the first terminal connected to an internal terminal X21, so as to encircle around the internal terminal X21 in a clockwise direction, and the second terminal corresponding to the end point is connected to an internal terminal X22. In contrast, the primary winding 232p is formed in a spiral shape starting at the first terminal connected to an internal terminal X23, so as to encircle around the internal terminal X23 in a counterclockwise direction, and the second terminal corresponding to the end point is connected to the internal terminal X22. Note that the internal terminals X21, X22, and X23 are aligned linearly in order as illustrated in the diagram.

The internal terminal X21 is connected to the external terminal T21 in the second layer 230b through a conductive wiring Y21 and a conductive via Z21. The internal terminal X22 is connected to the external terminal T22 in the second layer 230b through a conductive wiring Y22 and a conductive via Z22. The internal terminal X23 is connected to the external terminal T23 in the second layer 230b through a conductive wiring Y23 and a conductive via Z23. Note that the external terminals T21 to T23 are aligned linearly, and are used for wire bonding with the controller chip 210.

The secondary winding 231s is formed in a spiral shape starting at the first terminal connected to the external terminal T24, so as to encircle around the external terminal T24 in the counterclockwise direction, and the second terminal corresponding to the end point is connected to the external terminal T25. In contrast, the secondary winding 232s is formed in a spiral shape starting at the first terminal connected to the external terminal T26, so as to encircle around the external terminal T26 in the clockwise direction, and the second terminal corresponding to the end point is connected to the external terminal T25. Note that the external terminals T24, T25, and T26 are aligned linearly in order as illustrated in the diagram, and are used for wire bonding with the driver chip 220.

The secondary windings 231s and 232s are AC connected to the primary windings 231p and 232p, respectively, by magnetic coupling, and are DC insulated from the primary windings 231p and 232p. In other words, the driver chip 220 is AC connected to the controller chip 210 via the transformer chip 230, and is DC insulated from the controller chip 210 by the transformer chip 230.

<Signal Transmission Device (Two-Channelization)>

Figure 8:
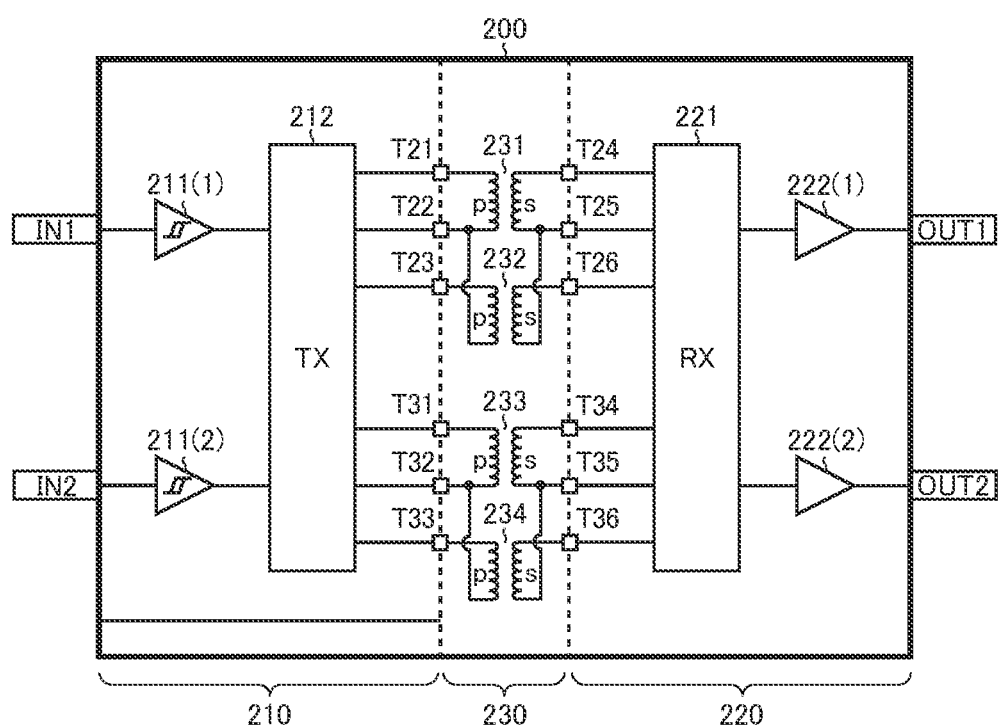
FIG. 8 is a diagram illustrating two-channelization of the signal transmission device.

FIG. 8 is a diagram illustrating two-channelization of the signal transmission device 200. As illustrated in this diagram, the signal transmission device 200 has two input terminals IN1 and IN2 and two output terminals OUT1 and OUT2 so that two-channel pulse transmission can be performed.

Note that a signal transmission path from the input terminal IN1 to the output terminal OUT1, via a Schmitt buffer 211(1), the pulse transmission circuit 212, the transformers 231 and 232, the pulse receiving circuit 221, and a driver 222(1), is for a first channel. In contrast, a signal transmission path from the input terminal IN2 to the output terminal OUT2, via a Schmitt buffer 211(2), the pulse transmission circuit 212, transformers 233 and 234, the pulse receiving circuit 221, and a driver 222(2), is for a second channel.

Further, the transformer chip 230 includes, in addition to the transformers 231 and 232 and the external terminals T21 to T26 for the first channel, the transformers 233 and 234 and external terminals T31 to T36 for the second channel.

The transformer 233 includes a primary winding 233p connected between the external terminal T31 and the external terminal T32. The transformer 234 includes a primary winding 234p connected between the external terminal T33 and the external terminal T32. The transformer 233 includes a secondary winding 233s connected between the external terminal T34 and the external terminal T35. The transformer 234 includes a secondary winding 234s connected between the external terminal T36 and the external terminal T35.

In this way, the transformer chip 230 includes, in addition to the external terminals T21 to T26 described above, the external terminal T31 connected to a first terminal of the primary winding 233p, the external terminal T32 connected to a second terminal of the primary winding 233p and a first terminal of the primary winding 234p, the external terminal T33 connected to a second terminal of the primary winding 234p, the external terminal T34 connected to a first terminal of the secondary winding 233s, the external terminal T35 connected to a second terminal of the secondary winding 233s and a first terminal of the secondary winding 234s, and the external terminal T36 connected to a second terminal of the secondary winding 234s.

<2-Channel Transformer Chip (Semiconductor Device)>

Figure 9:
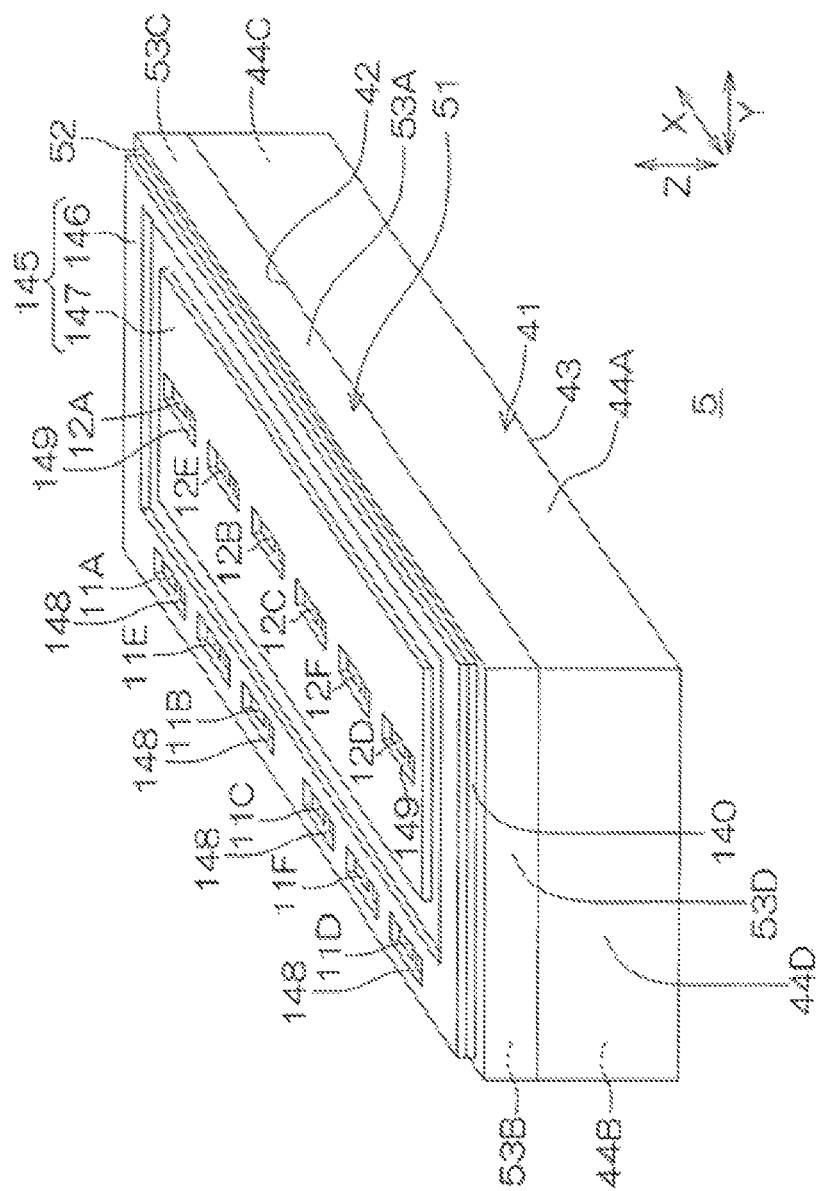
FIG. 9 is a perspective view of a semiconductor device that is used as the transformer chip illustrated in FIG. 8.
Figure 10:
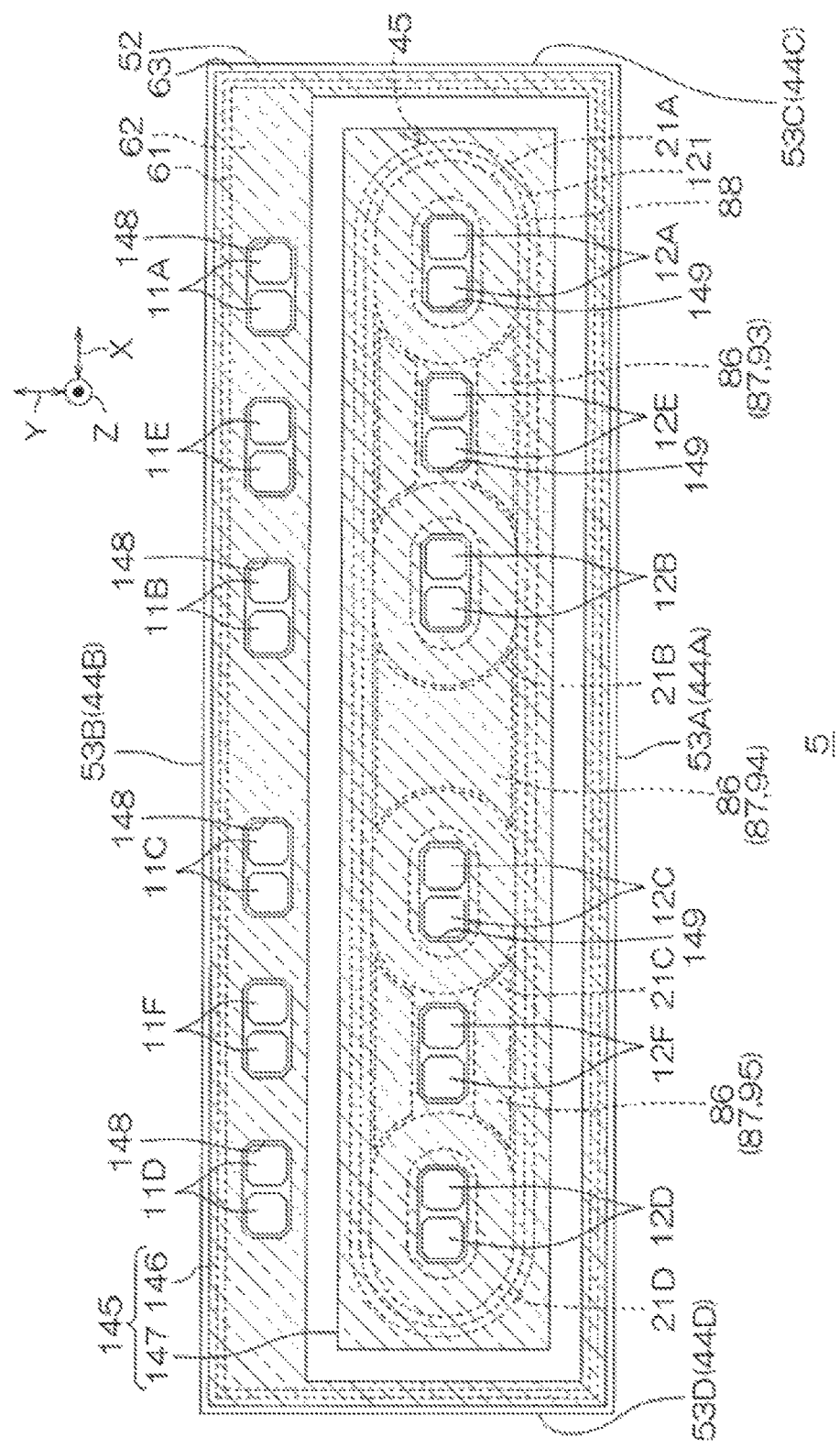
FIG. 10 is a plan view of the semiconductor device illustrated in FIG. 9.
Figure 11:
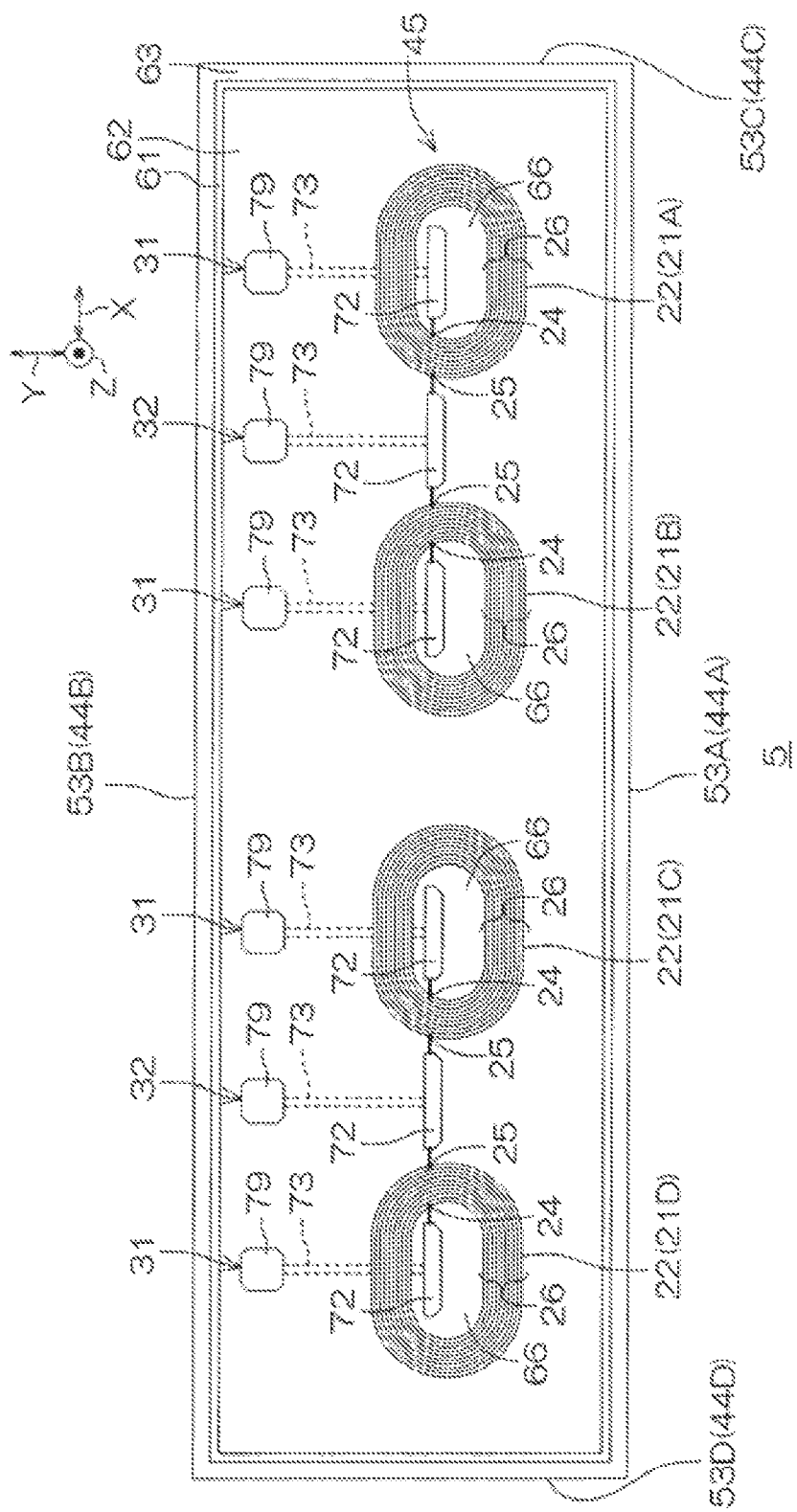
FIG. 11 is a plan view illustrating a layer in which a low potential coil is formed in the semiconductor device illustrated in FIG. 9.
Figure 12:
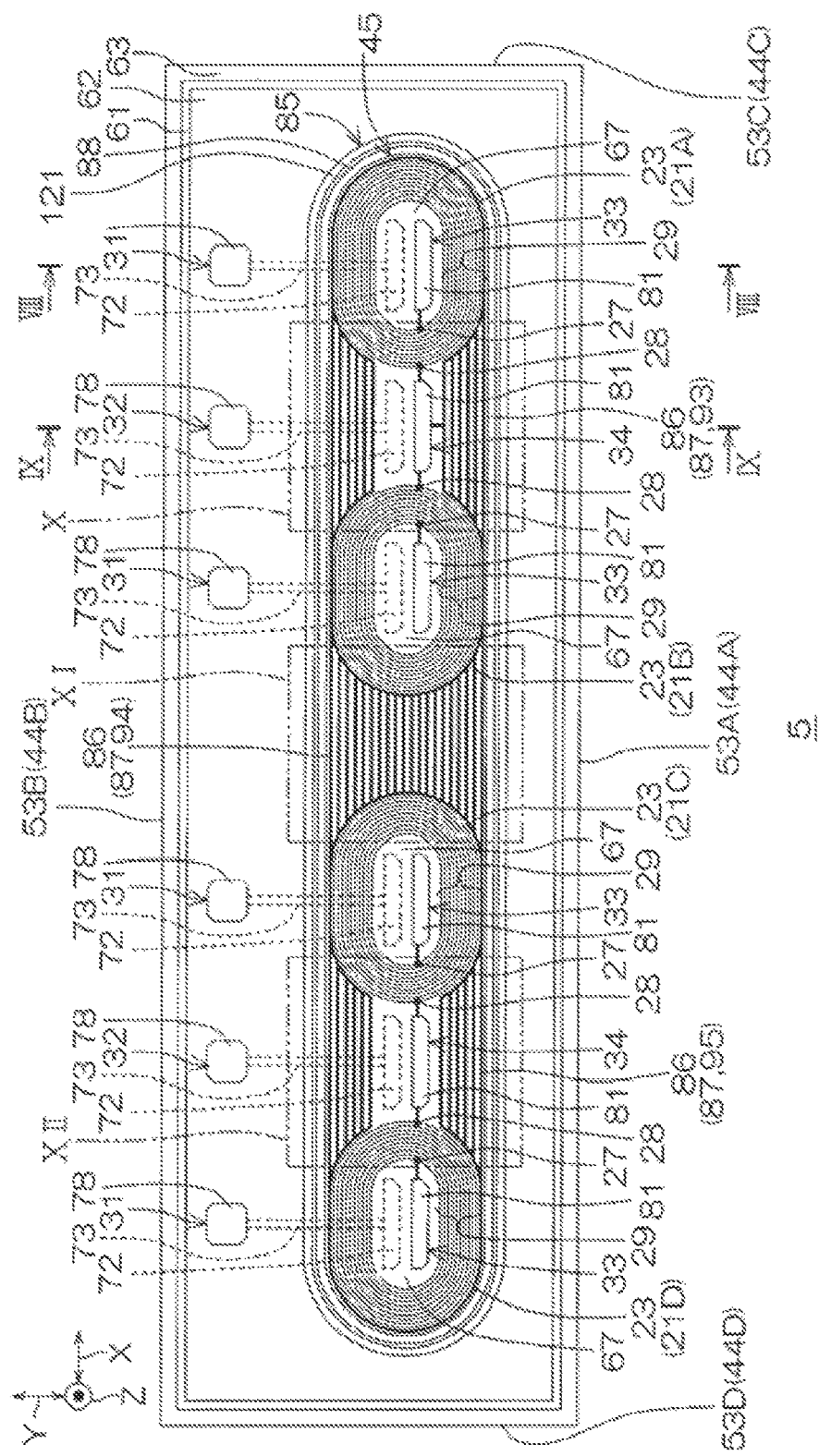
FIG. 12 is a plan view illustrating a layer in which a high potential coil is formed in the semiconductor device illustrated in FIG. 9.
Figure 13:
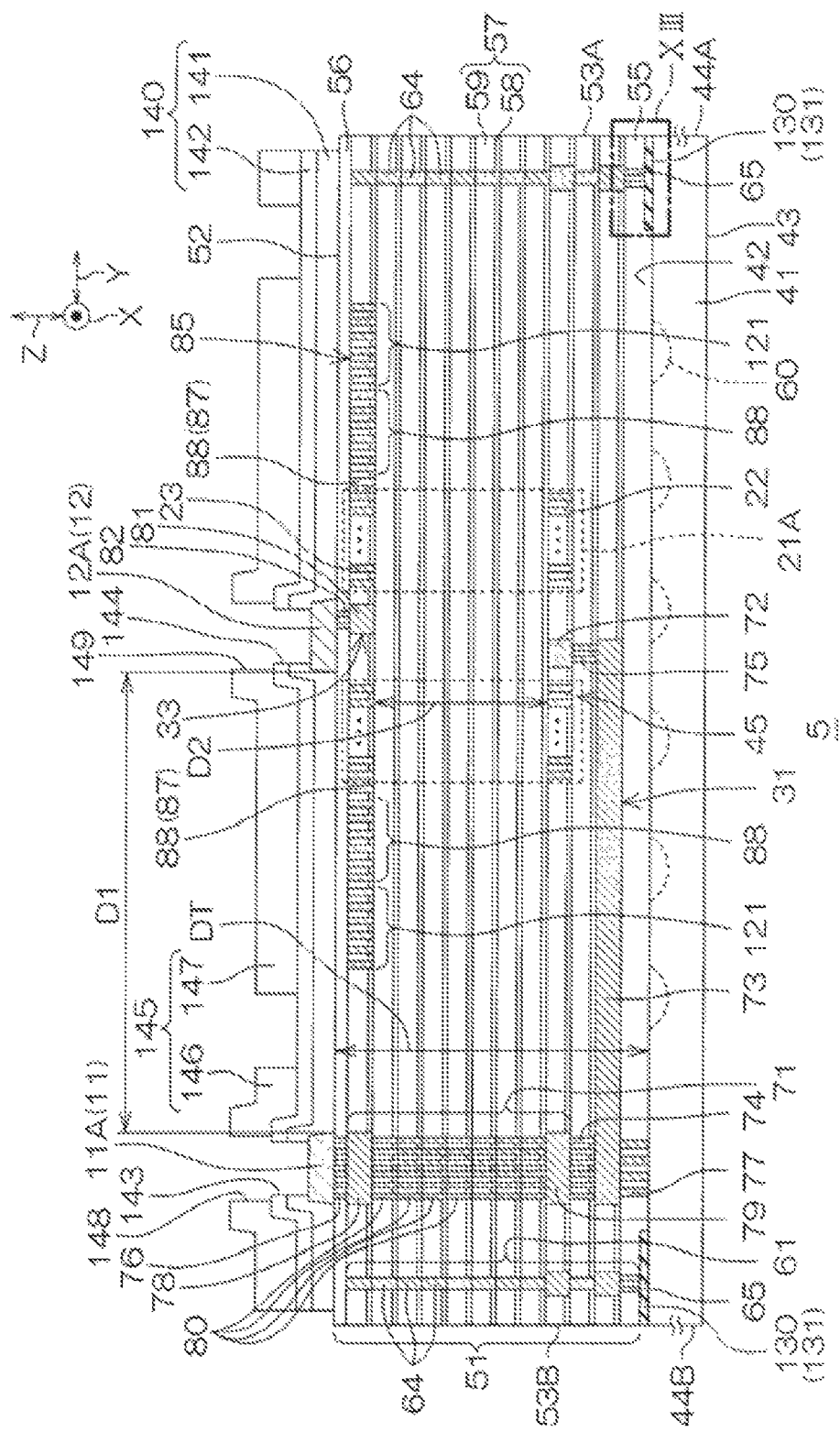
FIG. 13 is a cross-sectional view taken along a line VIII-VIII illustrated in FIG. 12.
Figure 14:
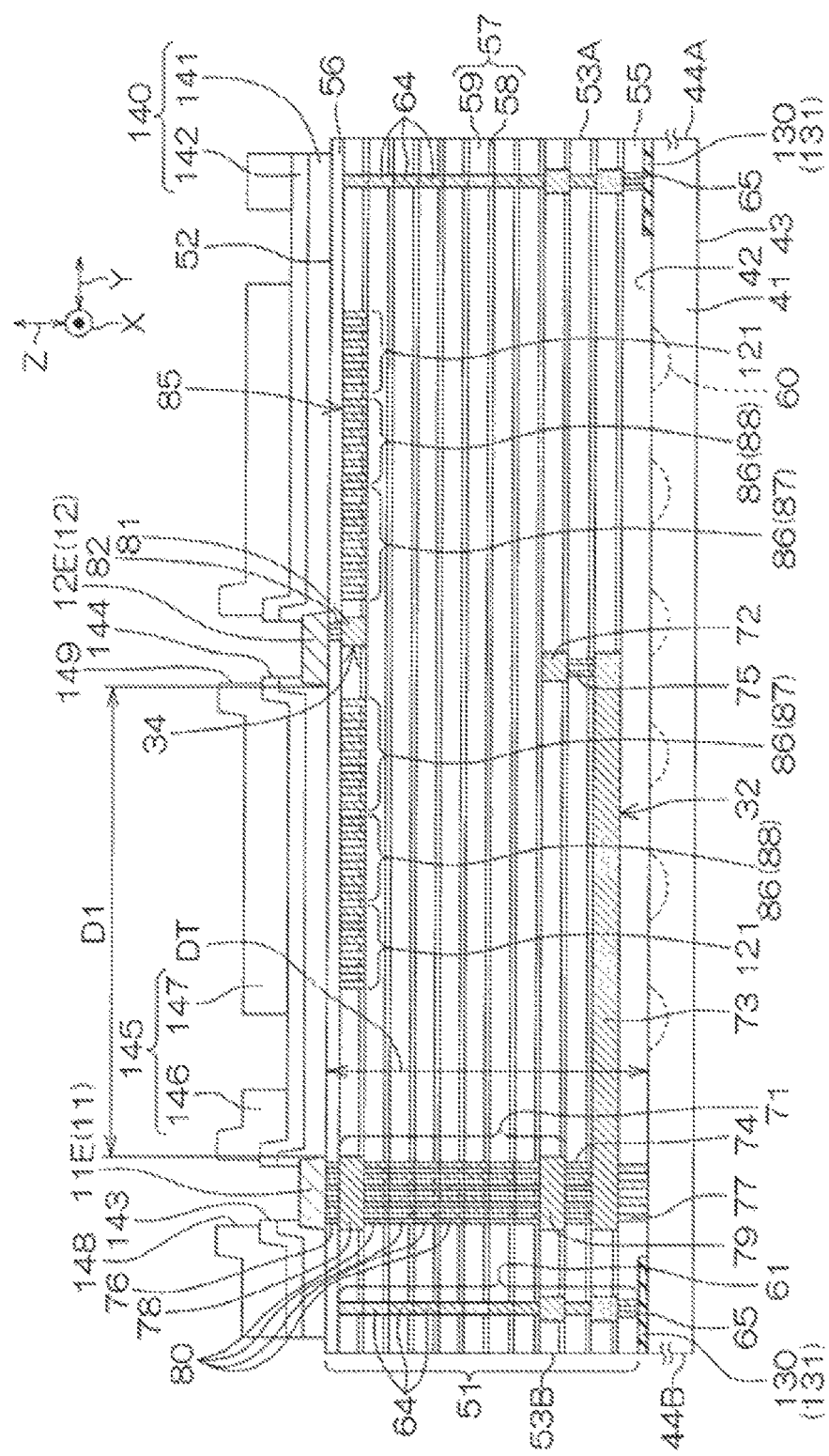
FIG. 14 is a cross-sectional view taken along a line IX-IX illustrated in FIG. 12.
Figure 15:
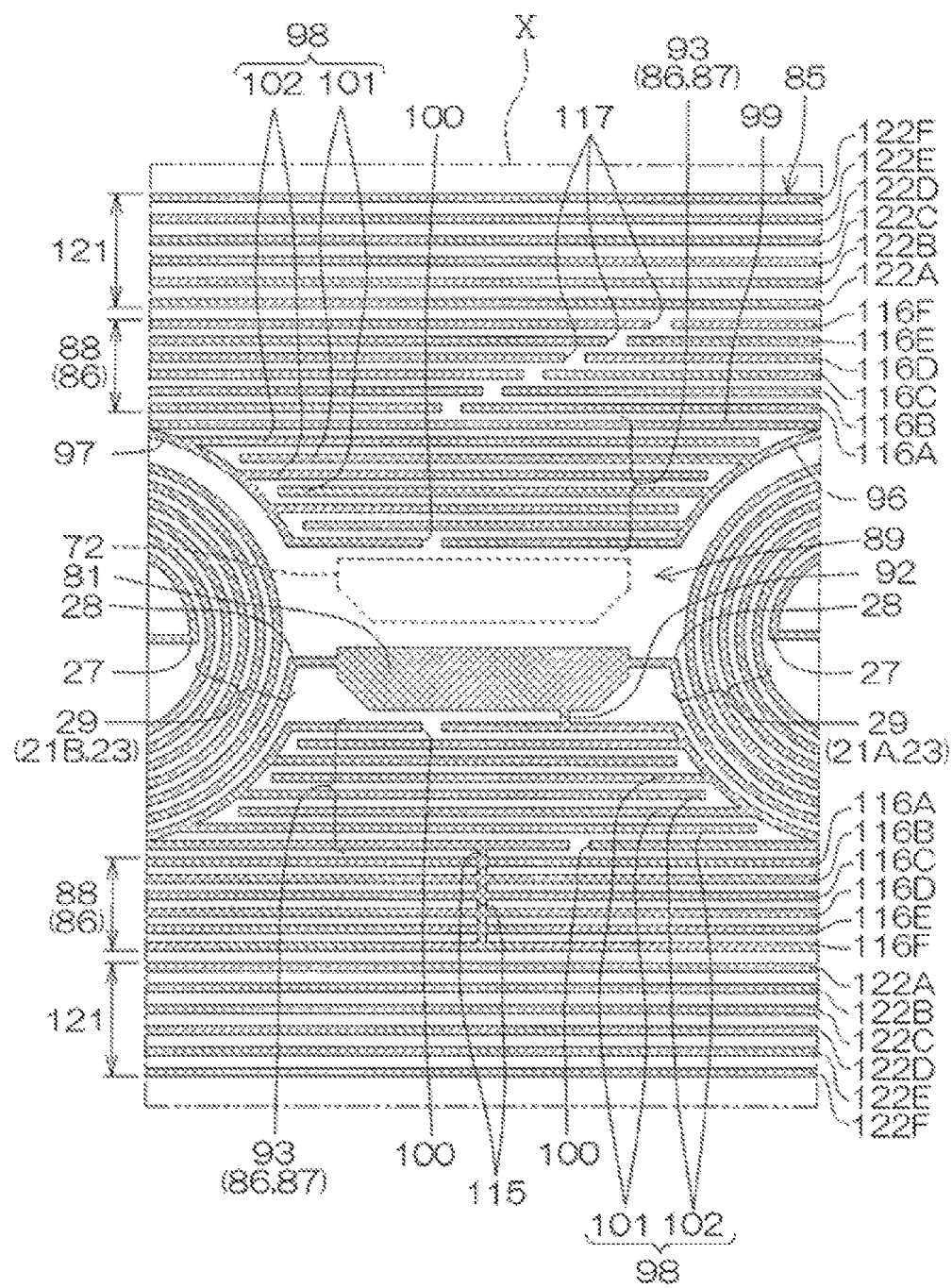
FIG. 15 is an enlarged view of an region X illustrated in FIG. 12.
Figure 16:
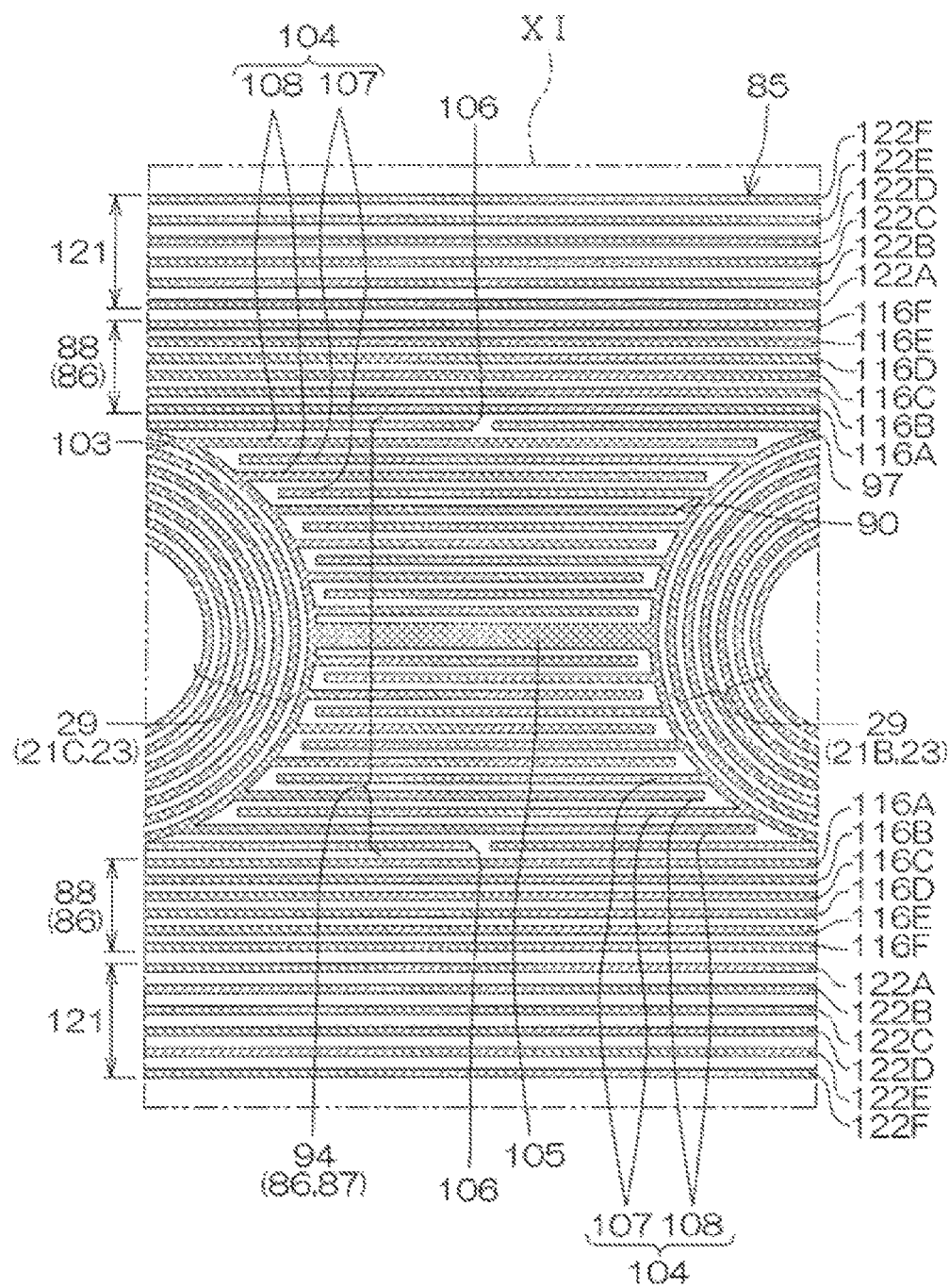
FIG. 16 is an enlarged view of an region XI illustrated in FIG. 12.
Figure 17:
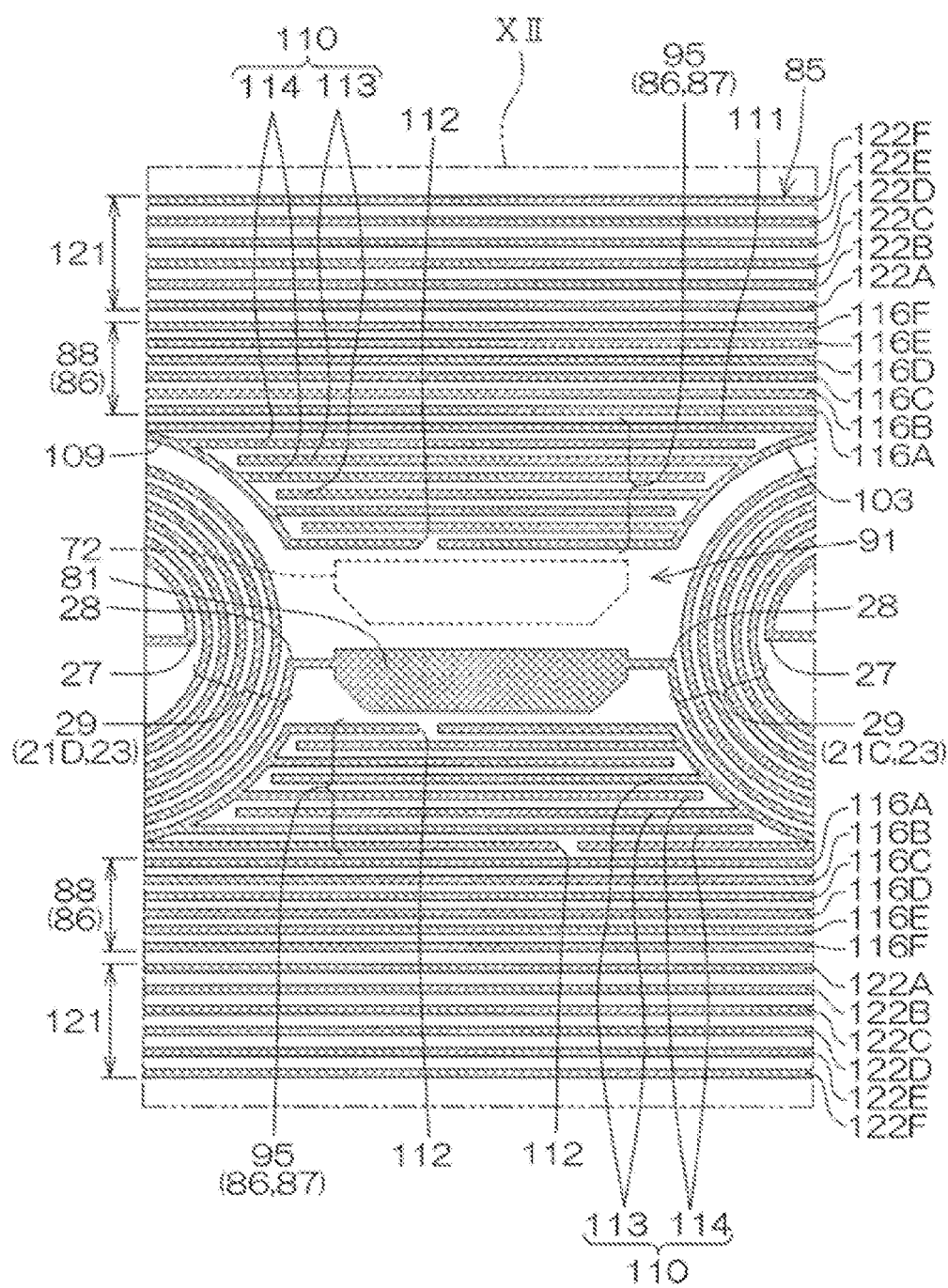
FIG. 17 is an enlarged view of an region XII illustrated in FIG. 12.
Figure 18:
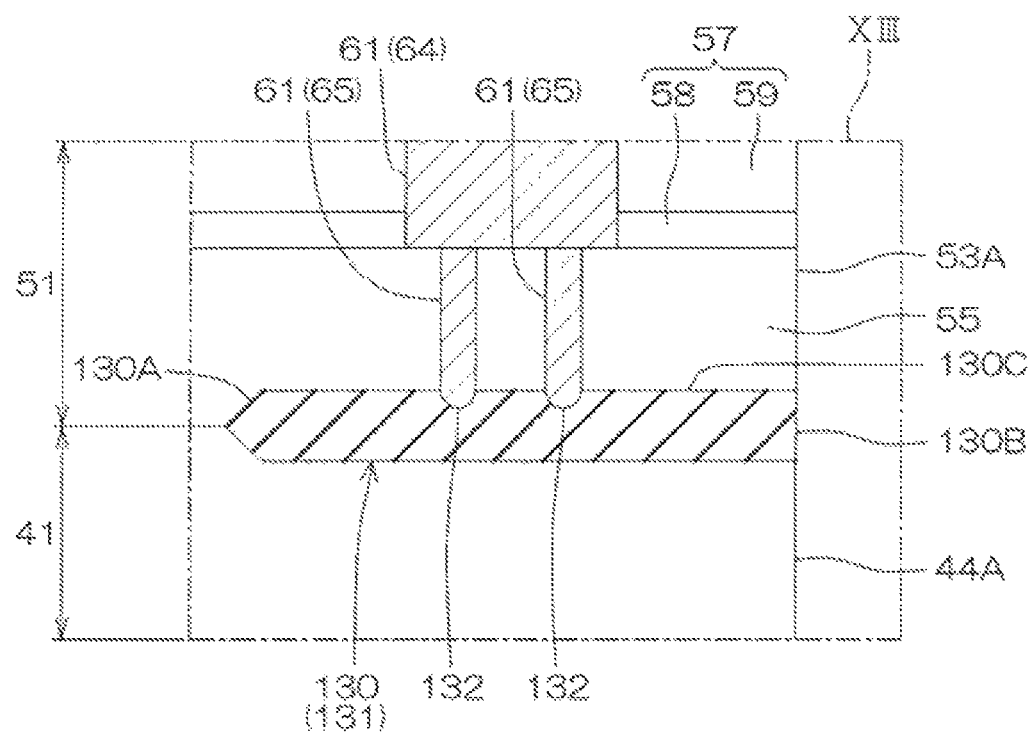
FIG. 18 is an enlarged view of an region XIII illustrated in FIG. 13, and is a diagram illustrating a separation structure.

FIG. 9 is a perspective view illustrating a semiconductor device 5 used as the transformer chip 230 illustrated in FIG. 8. FIG. 10 is a plan view of the semiconductor device 5 illustrated in FIG. 9. FIG. 11 is a plan view illustrating a layer of the semiconductor device 5 illustrated in FIG. 9, in which low potential coils 22 (corresponding to the primary windings 231p to 234p of the transformers 231 to 234 illustrated in FIG. 8) are formed. FIG. 12 is a plan view illustrating a layer of the semiconductor device 5 illustrated in FIG. 9, in which high potential coils 23 (corresponding to the secondary windings 231s to 234s of the transformers 231 to 234 illustrated in FIG. 8) are formed. FIG. 13 is a cross-sectional view taken along a line VIII-VIII illustrated in FIG. 12. FIG. 14 is a cross-sectional view taken along a line IX-IX illustrated in FIG. 12. FIG. 15 is an enlarged view of an region X illustrated in FIG. 12. FIG. 16 is an enlarged view of an region XI illustrated in FIG. 12. FIG. 17 is an enlarged view of an region XII illustrated in FIG. 12. FIG. 18 is an enlarged view of an region XIII illustrated in FIG. 13, and is a diagram illustrating a separation structure 130.

With reference to FIGS. 9 to 13, the semiconductor device 5 includes a semiconductor chip 41 having a rectangular parallelepiped shape. The semiconductor chip 41 contains at least one of silicon, wide band gap semiconductor, and compound semiconductor.

The wide band gap semiconductor is constituted of a semiconductor having a band gap wider than that of silicon (approximately 1.12 eV). The wide band gap semiconductor preferably has a band gap of 2.0 eV or wider. The wide band gap semiconductor may be silicon carbide (SiC). The compound semiconductor may be III-V group compound semiconductor. The compound semiconductor may contain at least one of aluminum nitride (AlN), indium nitride (InN), gallium nitride (GaN), and gallium arsenide (GaAs).

The semiconductor chip 41 includes a silicon semiconductor substrate, in this embodiment. The semiconductor chip 41 may be an epitaxial substrate having a laminated structure including a silicon semiconductor substrate and a silicon epitaxial layer. A conductive type of the semiconductor substrate may be an n-type or a p-type. The epitaxial layer may be an n-type or a p-type.

The semiconductor chip 41 includes a first principal surface 42 on one side, a second principal surface 43 on the other side, and chip side walls 44A to 44D connecting the first principal surface 42 and the second principal surface 43. The first principal surface 42 and the second principal surface 43 are formed in a quadrangular shape (a rectangular shape in this embodiment) in a plan view viewed in the normal direction Z thereof (hereinafter referred simply to as "in a plan view").

The chip side walls 44A to 44D include the first chip side wall 44A, the second chip side wall 44B, the third chip side wall 44C, and the fourth chip side wall 44D. The first chip side wall 44A and the second chip side wall 44B form long sides of the semiconductor chip 41. The first chip side wall 44A and the second chip side wall 44B extend in a first direction X and face each other in a second direction Y. The third chip side wall 44C and the fourth chip side wall 44D form short sides of the semiconductor chip 41. The third chip side wall 44C and the fourth chip side wall 44D extend in the second direction Y and face each other in the first direction X. The chip side walls 44A to 44D have a ground surface.

The semiconductor device 5 further includes an insulation layer 51 formed on the first principal surface 42 of the semiconductor chip 41. The insulation layer 51 includes an insulation principal surface 52 and insulation side walls 53A to 53D. The insulation principal surface 52 is formed in a quadrangular shape (a rectangular shape in this embodiment) matching the first principal surface 42 in a plan view. The insulation principal surface 52 extends in parallel to the first principal surface 42.

The insulation side walls 53A to 53D include the first insulation side wall 53A, the second insulation side wall 53B, the third insulation side wall 53C, and the fourth insulation side wall 53D. The insulation side walls 53A to 53D extend from the periphery of the insulation principal surface 52 to the semiconductor chip 41, so as to range to the chip side walls 44A to 44D, respectively. Specifically, the insulation side walls 53A to 53D are formed to be flush with the chip side walls 44A to 44D, respectively. The insulation side walls 53A to 53D have ground surfaces flush with the chip side walls 44A to 44D, respectively.

The insulation layer 51 has a multilayer insulation laminated structure including a bottom insulation layer 55, a top insulation layer 56 and plurality of (in this embodiment, 11) interlayer insulation layers 57. The bottom insulation layer 55 is an insulation layer that directly covers the first principal surface 42. The top insulation layer 56 is an insulation layer forming the insulation principal surface 52. The plurality of interlayer insulation layers 57 are insulation layers disposed between the bottom insulation layer 55 and the top insulation layer 56. The bottom insulation layer 55 has a single layer structure containing silicon oxide in this embodiment. The top insulation layer 56 has a single layer structure containing silicon oxide in this embodiment. The bottom insulation layer 55 and the top insulation layer 56 may have a thicknesses of 1 μm or more and 3 μm or less (e.g. approximately 2 μm).

Each of the plurality of interlayer insulation layers 57 has a laminated structure including a first insulation layer 58 on the side of the bottom insulation layer 55 and a second insulation layer 59 on the side of the top insulation layer 56. The first insulation layer 58 may contain silicon nitride. The first insulation layer 58 is formed as an etching stopper layer for the second insulation layer 59. The first insulation layer 58 may have a thickness of 0.1 μm or more and 1 μm or less (e.g. approximately 0.3 μm).

The second insulation layer 59 is formed on the first insulation layer 58 and contains insulation material different from that of the first insulation layer 58. The second insulation layer 59 may contain silicon oxide. The second insulation layer 59 may have a thickness of 1 μm or more and 3 μm or less (e.g. approximately 2 μm). The second insulation layer 59 preferably has a thickness more than that of the first insulation layer 58.

The insulation layer 51 may have a total thickness DT of 5 μm or more and 50 μm or less. The total thickness DT of the insulation layer 51 and the number of layers of the interlayer insulation layer 57 are arbitrary and are adjusted in accordance with dielectric voltage (dielectric breakdown strength) to be achieved. In addition, insulation material of the bottom insulation layer 55, the top insulation layer 56, and the interlayer insulation layer 57 is arbitrary and is not limited to a particular insulation material.

The semiconductor device 5 includes a first function device 45 formed in the insulation layer 51. The first function device 45 includes one or more (in this embodiment, a plurality of) transformers 21. In other words, the semiconductor device 5 is constituted of a multichannel type device including the plurality of transformers 21. The plurality of transformers 21 are formed in an inner part of the insulation layer 51 with a space from the insulation side walls 53A to 53D. The plurality of transformers 21 are formed with spaces in the first direction X.

Specifically, the plurality of transformers 21 includes a first transformer 21A, a second transformer 21B, a third transformer 21C, and a fourth transformer 21D (corresponding to the transformers 231 to 234, respectively, illustrated in FIG. 8) formed in order from the side of the insulation side wall 53C to the side of the insulation side wall 53D in a plan view. The plurality of transformers 21A to 21D have the same structure. In the following description, the structure of the first transformer 21A is exemplified and described. Descriptions of the structures of the second transformer 21B, the third transformer 21C, and the fourth transformer 21D are omitted, because the description of the structure of the first transformer 21A is applied to them.

With reference to FIGS. 11 to 14, the first transformer 21A includes the low potential coil 22 and the high potential coil 23 (corresponding respectively to the primary winding 231p and the secondary winding 231s of the transformer 231 illustrated in FIG. 8). The low potential coil 22 is formed in the insulation layer 51. The high potential coil 23 is formed in the insulation layer 51 so as to face the low potential coil 22 in the normal direction Z. In this embodiment, the low potential coil 22 and the high potential coil 23 are formed in the region between the bottom insulation layer 55 and the top insulation layer 56 (i.e. the plurality of interlayer insulation layers 57).

The low potential coil 22 is formed in the insulation layer 51 on the side of the bottom insulation layer 55 (the semiconductor chip 41), and the high potential coil 23 is formed in the insulation layer 51 on the side of the top insulation layer 56 (the insulation principal surface 52) with respect to the low potential coil 22. In other words, the high potential coil 23 faces the semiconductor chip 41 via the low potential coil 22. The low potential coil 22 and the high potential coil 23 are disposed at any positions. In addition, it is sufficient that the high potential coil 23 faces the low potential coil 22 via one or more interlayer insulation layers 57.

The distance between the low potential coil 22 and the high potential coil 23 (i.e. the number of layers of the interlayer insulation layers 57) is appropriately adjusted in accordance with dielectric voltage and electric field intensity between the low potential coil 22 and the high potential coil 23. The low potential coil 22 is formed in the third interlayer insulation layer 57 from the bottom insulation layer 55 in this embodiment. The high potential coil 23 is formed in the first interlayer insulation layer 57 from the top insulation layer 56 in this embodiment.

The low potential coil 22 is embedded in the interlayer insulation layer 57 so as to penetrate the first insulation layer 58 and the second insulation layer 59. The low potential coil 22 includes a first inner end 24, a first outer end 25, and a first spiral part 26 patterned in a spiral shape between the first inner end 24 and the first outer end 25. The first spiral part 26 is patterned in an elliptical (oval) spiral shape in a plan view. The inner rim part of the first spiral part 26 defines an elliptical first inside region 66 in a plan view.

The number of turns of the first spiral part 26 may be 5 or more and 30 or less. The first spiral part 26 may have a width of 0.1 μm or more and 5 μm or less. The first spiral part 26 preferably has a width of 1 μm or more and 3 μm or less. The width of the first spiral part 26 is defined by the width in a direction perpendicular to the spiral direction. The first spiral part 26 may have a first winding pitch of 0.1 μm or more and 5 μm or less. The first winding pitch is preferably 1 μm or more and 3 μm or less. The first winding pitch is defined by a distance between two parts of the first spiral part 26 neighboring in a direction perpendicular to the spiral direction.

The winding shape of the first spiral part 26 and the planar shape of the first inside region 66 are arbitrary and are not limited to those illustrated in FIG. 11 or the like. The first spiral part 26 may have a polygonal winding shape such as a rectangular shape or a quadrangular shape, or a circular shape in a plan view. The first inside region 66 may be defined as a polygonal shape such as a rectangular shape or a quadrangular shape, or as a circular shape in a plan view, corresponding to the winding shape of the first spiral part 26.

The low potential coil 22 may contain at least one of titanium, titanium nitride, copper, aluminum, and tungsten. The low potential coil 22 may have a laminated structure including a barrier layer and a body layer. The barrier layer defines a recessed region in the interlayer insulation layer 57. The body layer is embedded in the recessed region defined by the barrier layer. The barrier layer may contain at least one of titanium and titanium nitride. The body layer may contain at least one of copper, aluminum, and tungsten.

The high potential coil 23 is embedded in the interlayer insulation layer 57 so as to penetrate the first insulation layer 58 and the second insulation layer 59. The high potential coil 23 includes a second inner end 27, a second outer end 28, and a second spiral part 29 patterned in a spiral shape between the second inner end 27 and the second outer end 28. The second spiral part 29 is patterned in an elliptical (oval) spiral shape in a plan view. The inner rim part of the second spiral part 29 defines an elliptical second inside region 67 in a plan view in this embodiment. The second inside region 67 of the second spiral part 29 faces the first inside region 66 of the first spiral part 26 in the normal direction Z.

The number of turns of the second spiral part 29 may be 5 or more and 30 or less. The number of turns of the second spiral part 29 with respect to that of the first spiral part 26 is adjusted in accordance with a voltage value to be stepped up. The number of turns of the second spiral part 29 is preferably more than that of the first spiral part 26. As a matter of course, the number of turns of the second spiral part 29 may be less than or equal to that of the first spiral part 26.

The width of the second spiral part 29 may be 0.1 μm or more and 5 μm or less. The width of the second spiral part 29 is preferably 1 μm or more and 3 μm or less. The width of the second spiral part 29 is defined by the width in a direction perpendicular to the spiral direction. The width of the second spiral part 29 is preferably equal to that of the first spiral part 26.

A second winding pitch of the second spiral part 29 may be 0.1 μm or more and 5 μm or less. The second winding pitch is preferably 1 μm or more and 3 μm or less. The second winding pitch is defined by a distance between two parts of the second spiral part 29 neighboring in a direction perpendicular to the spiral direction. The second winding pitch is preferably equal to the first winding pitch of the first spiral part 26.

The winding shape of the second spiral part 29 and the planar shape of the second inside region 67 are arbitrary and are not limited to those illustrated in FIG. 12 or the like. The second spiral part 29 may have a polygonal winding shape such as a rectangular shape or a quadrangular shape, or a circular shape in a plan view. The second inside region 67 may be defined as a polygonal shape such as a rectangular shape or a quadrangular shape, or as a circular shape in a plan view, corresponding to the winding shape of the second spiral part 29.

The high potential coil 23 is preferably formed of the same conductive material as the low potential coil 22. In other words, the high potential coil 23 preferably includes a barrier layer and a body layer similarly to the low potential coil 22.

With reference to FIG. 10, the semiconductor device 5 includes a plurality of (in this embodiment, 12) low potential terminals 11 (corresponding respectively to the external terminals T21 to T23 and the external terminals T31 to T33 illustrated in FIG. 8), and a plurality of (in this embodiment, 12) high potential terminals 12 (corresponding respectively to the external terminals T24 to T26 and the external terminals T34 to T36 illustrated in FIG. 8). The plurality of low potential terminals 11 are electrically connected to the low potential coils 22 of the corresponding transformers 21A to 21D, respectively. The plurality of high potential terminals 12 are electrically connected to the high potential coils 23 of the corresponding transformers 21A to 21D, respectively.

The plurality of low potential terminals 11 are formed on the insulation principal surface 52 of the insulation layer 51. Specifically, the plurality of low potential terminals 11 are formed in a region on the side of the insulation side wall 53B with a space from the plurality of transformers 21A to 21D in the second direction Y, and are arranged with spaces in the first direction X.

The plurality of low potential terminals 11 includes a first low potential terminal 11A, a second low potential terminal 11B, a third low potential terminal 11C, a fourth low potential terminal 11D, a fifth low potential terminal 11E, and a sixth low potential terminal 11F. Each of the plurality of low potential terminals 11A to 11F is formed in two in this embodiment. The number of the plurality of low potential terminals 11A to 11F is arbitrary.

The first low potential terminal 11A faces the first transformer 21A in the second direction Y in a plan view. The second low potential terminal 11B faces the second transformer 21B in the second direction Y in a plan view. The third low potential terminal 11C faces the third transformer 21C in the second direction Y in a plan view. The fourth low potential terminal 11D faces the fourth transformer 21D in the second direction Y in a plan view. The fifth low potential terminal 11E is formed in the region between the first low potential terminal 11A and the second low potential terminal 11B in a plan view. The sixth low potential terminal 11F is formed in the region between the third low potential terminal 11C and the fourth low potential terminal 11D in a plan view.

The first low potential terminal 11A is electrically connected to the first inner end 24 of the first transformer 21A (the low potential coil 22). The second low potential terminal 11B is electrically connected to the first inner end 24 of the second transformer 21B (the low potential coil 22). The third low potential terminal 11C is electrically connected to the first inner end 24 of the third transformer 21C (the low potential coil 22). The fourth low potential terminal 11D is electrically connected to the first inner end 24 of the fourth transformer 21D (the low potential coil 22).

The fifth low potential terminal 11E is electrically connected to the first outer end 25 of the first transformer 21A (the low potential coil 22) and the first outer end 25 of the second transformer 21B (the low potential coil 22). The sixth low potential terminal 11F is electrically connected to the first outer end 25 of the third transformer 21C (the low potential coil 22) and the first outer end 25 of the fourth transformer 21D (the low potential coil 22).

The plurality of high potential terminals 12 are formed on the insulation principal surface 52 of the insulation layer 51 with a space from the plurality of low potential terminals 11. Specifically, the plurality of high potential terminals 12 are formed in a region on the side of the insulation side wall 53A with a space from the plurality of low potential terminals 11 in the second direction Y, and are arranged with spaces in the first direction X.

The plurality of high potential terminals 12 are formed in regions adjacent to the corresponding transformers 21A to 21D, respectively, in a plan view. That the high potential terminals 12 are adjacent to the transformers 21A to 21D means that the distance between the high potential terminal 12 and the transformer 21 is less than the distance between the low potential terminal 11 and the high potential terminal 12, in a plan view.

Specifically, the plurality of high potential terminals 12 are formed with spaces in the first direction X so as to face the plurality of transformers 21A to 21D in the first direction X, in a plan view. More specifically, the plurality of high potential terminals 12 are formed with spaces in the first direction X so as to be positioned in the region between the second inside region 67 of the high potential coil 23 and the neighboring high potential coil 23, in a plan view. In this way, the plurality of high potential terminals 12 are arranged in a line in the first direction X with the plurality of transformers 21A to 21D, in a plan view.

The plurality of high potential terminals 12 include a first high potential terminal 12A, a second high potential terminal 12B, a third high potential terminal 12C, a fourth high potential terminal 12D, a fifth high potential terminal 12E, and a sixth high potential terminal 12F. Each of the plurality of high potential terminals 12A to 12F is formed in two in this embodiment. The number of the plurality of high potential terminals 12A to 12F is arbitrary.

The first high potential terminal 12A is formed in the second inside region 67 of the first transformer 21A (the high potential coil 23) in a plan view. The second high potential terminal 12B is formed in the second inside region 67 of the second transformer 21B (the high potential coil 23) in a plan view. The third high potential terminal 12C is formed in the second inside region 67 of the third transformer 21C (the high potential coil 23) in a plan view. The fourth high potential terminal 12D is formed in the second inside region 67 of the fourth transformer 21D (the high potential coil 23) in a plan view. The fifth high potential terminal 12E is formed in the region between the first transformer 21A and the second transformer 21B in a plan view. The sixth high potential terminal 12F is formed in the region between the third transformer 21C and the fourth transformer 21D in a plan view.

The first high potential terminal 12A is electrically connected to the second inner end 27 of the first transformer 21A (the high potential coil 23). The second high potential terminal 12B is electrically connected to the second inner end 27 of the second transformer 21B (the high potential coil 23). The third high potential terminal 12C is electrically connected to the second inner end 27 of the third transformer 21C (the high potential coil 23). The fourth high potential terminal 12D is electrically connected to the second inner end 27 of the fourth transformer 21D (the high potential coil 23).

The fifth high potential terminal 12E is electrically connected to the second outer end 28 of the first transformer 21A (the high potential coil 23) and the second outer end 28 of the second transformer 21B (the high potential coil 23). The sixth high potential terminal 12F is electrically connected to the second outer end 28 of the third transformer 21C (the high potential coil 23) and the second outer end 28 of the fourth transformer 21D (the high potential coil 23).

With reference to FIGS. 11 to 14, the semiconductor device 5 includes a first low potential wiring 31, a second low potential wiring 32, a first high potential wiring 33, and a second high potential wiring 34 formed in the insulation layer 51. In this embodiment, a plurality of first low potential wirings 31, a plurality of the second low potential wirings 32, a plurality of the first high potential wirings 33, and a plurality of the second high potential wirings 34 are formed.

The first low potential wiring 31 and the second low potential wiring 32 fix the low potential coil 22 of the first transformer 21A and the low potential coil 22 of the second transformer 21B at the same potential. In addition, the first low potential wiring 31 and the second low potential wiring 32 fix the low potential coil 22 of the third transformer 21C and the low potential coil 22 of the fourth transformer 21D at the same potential. The first low potential wiring 31 and the second low potential wiring 32 fix all the low potential coils 22 of the transformers 21A to 21D at the same potential in this embodiment.

The first high potential wiring 33 and the second high potential wiring 34 fix the high potential coil 23 of the first transformer 21A and the high potential coil 23 of the second transformer 21B at the same potential. In addition, the first high potential wiring 33 and the second high potential wiring 34 fix the high potential coil 23 of the third transformer 21C and the high potential coil 23 of the fourth transformer 21D at the same potential. The first high potential wiring 33 and the second high potential wiring 34 fix all the high potential coils 23 of the transformers 21A to 21D at the same potential in this embodiment.

The plurality of first low potential wirings 31 are electrically connected to the corresponding low potential terminals 11A to 11D and the first inner ends 24 of the corresponding transformers 21A to 21D (the low potential coil 22), respectively. The plurality of first low potential wirings 31 have the same structure. In the following description, the structure of the first low potential wiring 31 connected to the first low potential terminal 11A and the first transformer 21A is exemplified and described. Descriptions of structures of other first low potential wirings 31 are omitted, because the description of the structure of the first low potential wiring 31 connected to the first transformer 21A is applied to them.

The first low potential wiring 31 includes a through wiring 71, a low potential connection wiring 72, a lead wiring 73, a first connection plug electrode 74, a second connection plug electrode 75, one or more (in this embodiment, a plurality of) pad plug electrodes 76, and one or more (in this embodiment, a plurality of) substrate plug electrodes 77.

The through wiring 71, the low potential connection wiring 72, the lead wiring 73, the first connection plug electrode 74, the second connection plug electrode 75, the pad plug electrode 76 and the substrate plug electrode 77 are preferably formed of the same conductive material as the low potential coil 22 or the like. In other words, each of the through wiring 71, the low potential connection wiring 72, the lead wiring 73, the first connection plug electrode 74, the second connection plug electrode 75, the pad plug electrode 76, and the substrate plug electrode 77 preferably includes the barrier layer and the body layer similarly to the low potential coil 22 or the like.

The through wiring 71 penetrates the plurality of interlayer insulation layers 57 in the insulation layer 51 and extends like a column in the normal direction Z. The through wiring 71 is formed in the region between the bottom insulation layer 55 and the top insulation layer 56 in the insulation layer 51 in this embodiment. The through wiring 71 has a top end part on the side of the top insulation layer 56 and a bottom end part on the side of the bottom insulation layer 55. The top end part of the through wiring 71 is formed in the same interlayer insulation layer 57 as the high potential coil 23 and is covered by the top insulation layer 56. The bottom end part of the through wiring 71 is formed in the same interlayer insulation layer 57 as the low potential coil 22.

The through wiring 71 includes a first electrode layer 78, a second electrode layer 79, and a plurality of wiring plug electrodes 80 in this embodiment. In the through wiring 71, the first electrode layer 78, the second electrode layer 79, and the wiring plug electrode 80 are formed of the same conductive material as the low potential coil 22 and the like. In other words, each of the first electrode layer 78, the second electrode layer 79, and the wiring plug electrode 80 includes the barrier layer and the body layer similarly to the low potential coil 22 or the like.

The first electrode layer 78 forms the top end part of the through wiring 71. The second electrode layer 79 forms the bottom end part of the through wiring 71. The first electrode layer 78 is formed like an island and faces the low potential terminal 11 (the first low potential terminal 11A) in the normal direction Z. The second electrode layer 79 is formed like an island and faces the first electrode layer 78 in the normal direction Z.

The plurality of wiring plug electrodes 80 are respectively embedded in the plurality of interlayer insulation layers 57 positioned in the region between the first electrode layer 78 and the second electrode layer 79. The plurality of wiring plug electrodes 80 are laminated from the bottom insulation layer 55 to the top insulation layer 56 so as to be electrically connected to each other, and electrically connects the first electrode layer 78 and the second electrode layer 79. The plurality of wiring plug electrodes 80 has an area less than that of the first electrode layer 78 or the second electrode layer 79.

The number of layers of the plurality of wiring plug electrodes 80 is equal to the number of layers of the plurality of interlayer insulation layers 57. The six wiring plug electrodes 80 are embedded in each interlayer insulation layer 57 in this embodiment, but any number of the wiring plug electrodes 80 may be embedded in each interlayer insulation layer 57. As a matter of course, one or more wiring plug electrodes 80 may be formed to penetrate the plurality of interlayer insulation layers 57.

The low potential connection wiring 72 is formed in the first inside region 66 of the first transformer 21A (the low potential coil 22) in the same interlayer insulation layer 57 as the low potential coil 22. The low potential connection wiring 72 is formed like an island and faces the high potential terminal 12 (the first high potential terminal 12A) in the normal direction Z. The low potential connection wiring 72 preferably has an area more than that of the wiring plug electrode 80. The low potential connection wiring 72 is electrically connected to the first inner end 24 of the low potential coil 22.

The lead wiring 73 is formed in the region between the semiconductor chip 41 and the through wiring 71 in the interlayer insulation layer 57. The lead wiring 73 is formed in the first interlayer insulation layer 57 from the bottom insulation layer 55 in this embodiment. The lead wiring 73 includes a first terminal part on one side, a second terminal part on the other side, and a wiring part connecting the first terminal part and the second terminal part. The first terminal part of the lead wiring 73 is positioned in the region between the semiconductor chip 41 and the bottom end part of the through wiring 71. The second terminal part of the lead wiring 73 is positioned in the region between the semiconductor chip 41 and the low potential connection wiring 72. The wiring part extends along the first principal surface 42 of the semiconductor chip 41, in a belt-like shape in the region between the first terminal part and the second terminal part.

The first connection plug electrode 74 is formed in the region between the through wiring 71 and the lead wiring 73 in the interlayer insulation layer 57, and is electrically connected to the through wiring 71 and the first terminal part of the lead wiring 73. The second connection plug electrode 75 is formed in the region between the low potential connection wiring 72 and the lead wiring 73 in the interlayer insulation layer 57, and is electrically connected to the low potential connection wiring 72 and the second terminal part of the lead wiring 73.

The plurality of the pad plug electrodes 76 are formed in the region between the low potential terminal 11 (the first low potential terminal 11A) and the through wiring 71 in the top insulation layer 56, and are electrically connected to the low potential terminal 11 and the top end part of the through wiring 71, respectively. The plurality of substrate plug electrodes 77 are formed in the region between the semiconductor chip 41 and the lead wiring 73 in the bottom insulation layer 55. The substrate plug electrodes 77 are formed in the region between the semiconductor chip 41 and the first terminal part of the lead wiring 73 in this embodiment, and are electrically connected to the semiconductor chip 41 and the first terminal part of the lead wiring 73, respectively.

With reference to FIG. 14, the plurality of second low potential wirings 32 are electrically connected to the corresponding low potential terminals 11E and 11F and the first outer ends 25 of the low potential coils 22 of the corresponding transformers 21A to 21D, respectively. The plurality of second low potential wirings 32 have the same structure. In the following description, the structure of the second low potential wiring 32 connected to the fifth low potential terminal 11E and the first transformer 21A (the second transformer 21B) is exemplified and described. Descriptions of structures of the other second low potential wirings 32 are omitted, because the description of the structure of the second low potential wiring 32 connected to the first transformer 21A (the second transformer 21B) is applied to them.

Similarly to the first low potential wiring 31, the second low potential wiring 32 includes the through wiring 71, the low potential connection wiring 72, the lead wiring 73, the first connection plug electrode 74, the second connection plug electrode 75, the pad plug electrode 76, and the substrate plug electrode 77. The second low potential wiring 32 has the same structure as the first low potential wiring 31 except that the low potential connection wiring 72 is electrically connected to the first outer end 25 of the first transformer 21A (the low potential coil 22) and the first outer end 25 of the second transformer 21B (the low potential coil 22).

The low potential connection wiring 72 of the second low potential wiring 32 is formed around the low potential coil 22 in the same interlayer insulation layer 57 as the low potential coil 22. Specifically, the low potential connection wiring 72 is formed in the region between the two neighboring low potential coils 22 in a plan view. The pad plug electrode 76 is formed in the region between the low potential terminal 11 (the fifth low potential terminal 11E) and the low potential connection wiring 72 in the top insulation layer 56, and is electrically connected to the low potential terminal 11 and the low potential connection wiring 72.

With reference to FIG. 13, the plurality of first high potential wirings 33 is electrically connected to the corresponding high potential terminals 12A to 12D and the second inner ends 27 of the corresponding transformers 21A to 21D (the high potential coil 23), respectively. The plurality of first high potential wirings 33 have the same structure. In the following description, the structure of the first high potential wiring 33 connected to the first high potential terminal 12A and the first transformer 21A is exemplified and described. Descriptions of structures of the other first high potential wirings 33 are omitted, because the description of the structure of the first high potential wiring 33 connected to the first transformer 21A is applied to them.

The first high potential wiring 33 includes a high potential connection wiring 81, and one or more (in this embodiment, a plurality of) pad plug electrodes 82. The high potential connection wiring 81 and the pad plug electrode 82 are preferably formed of the same conductive material as the low potential coil 22 or the like. In other words, similarly to the low potential coil 22 or the like, the high potential connection wiring 81 and the pad plug electrode 82 preferably include the barrier layer and the body layer.

The high potential connection wiring 81 is formed in the second inside region 67 of the high potential coil 23 in the same interlayer insulation layer 57 as the high potential coil 23. The high potential connection wiring 81 is formed like an island, and faces the high potential terminal 12 (the first high potential terminal 12A) in the normal direction Z. The high potential connection wiring 81 is electrically connected to the second inner end 27 of the high potential coil 23. The high potential connection wiring 81 is formed with a space from the low potential connection wiring 72 in a plan view, and does not face the low potential connection wiring 72 in the normal direction Z. In this way, an insulation distance between the low potential connection wiring 72 and the high potential connection wiring 81 is increased, and hence the dielectric voltage of the insulation layer 51 is improved.

The plurality of pad plug electrodes 82 are formed in the region between the high potential terminal 12 (the first high potential terminal 12A) and the high potential connection wiring 81 in the top insulation layer 56, and is electrically connected to the high potential terminal 12 and the high potential connection wiring 81. Each of the plurality of pad plug electrodes 82 has an area less than that of the high potential connection wiring 81 in a plan view.

With reference to FIG. 14, the plurality of second high potential wirings 34 are electrically connected to the corresponding high potential terminals 12E and 12F and the second outer ends 28 of the corresponding transformers 21A to 21D (the high potential coils 23), respectively. The plurality of second high potential wirings 34 have the same structure. In the following description, the structure of the second high potential wiring 34 connected to the fifth high potential terminal 12E and the first transformer 21A (the second transformer 21B) is exemplified and described. Descriptions of structures of the other second high potential wirings 34 are omitted, because the description of the structure of the second high potential wiring 34 connected to the first transformer 21A (the second transformer 21B) is applied to them.

Similarly to the first high potential wiring 33, the second high potential wiring 34 includes the high potential connection wiring 81 and the pad plug electrode 82. The second high potential wiring 34 has the same structure as the first high potential wiring 33 except that the high potential connection wiring 81 is electrically connected to the second outer end 28 of the first transformer 21A (the high potential coil 23) and the second outer end 28 of the second transformer 21B (the high potential coil 23).

The high potential connection wiring 81 of the second high potential wiring 34 is formed around the high potential coil 23 in the same interlayer insulation layer 57 as the high potential coil 23. The high potential connection wiring 81 is formed in the region between the two neighboring high potential coils 23 in a plan view, and faces the high potential terminal 12 (the fifth high potential terminal 12E) in the normal direction Z. The high potential connection wiring 81 is formed with a space from the low potential connection wiring 72 in a plan view, and does not face the low potential connection wiring 72 in the normal direction Z.

The plurality of pad plug electrodes 82 are formed in the region between the high potential terminal 12 (the fifth high potential terminal 12E) and the high potential connection wiring 81 in the top insulation layer 56, and is electrically connected to the high potential terminal 12 and the high potential connection wiring 81.

With respect to FIGS. 13 and 14, a distance D1 between the low potential terminal 11 and the high potential terminal 12 is preferably more than a distance D2 between the low potential coil 22 and the high potential coil 23 (D2<D1). The distance D1 is preferably more than the total thickness DT of the plurality of interlayer insulation layers 57 (DT<D1). A ratio D2/D1 of the distance D2 to the distance D1 may be 0.01 or more and 0.1 or less. The distance D1 is preferably 100 μm or more and 500 μm or less. The distance D2 may be 1 μm or more and 50 μm or less. The distance D2 is preferably 5 μm or more and 25 μm or less. The distance D1 and the distance D2 may have any values, and are appropriately adjusted in accordance with the dielectric voltage to be achieved.

With reference to FIGS. 12 to 17, the semiconductor device 5 includes a dummy pattern 85 embedded in the insulation layer 51 so as to be positioned around the transformers 21A to 21D in a plan view. In FIGS. 15 to 17, the dummy pattern 85 is shown by hatching. The dummy pattern 85 includes a conductor. The dummy pattern 85 is preferably formed of the same conductive material as the low potential coil 22 or the like. In other words, similarly to the low potential coil 22 or the like, the dummy pattern 85 preferably includes the barrier layer and the body layer.

The dummy pattern 85 is formed in a pattern (a discontinuous pattern) different from that of the high potential coil 23 or the low potential coil 22, and is independent of the transformers 21A to 21D. In other words, the dummy pattern 85 does not function as the transformers 21A to 21D. The dummy pattern 85 is formed as a shield conductor layer that shields an electric field between the low potential coil 22 and the high potential coil 23 in the transformers 21A to 21D, and suppresses concentration of electric field on the high potential coil 23.

The dummy pattern 85 is patterned in dense lines so as to partially cover and partially expose the region around the one or more high potential coils 23 in a plan view in this embodiment. The dummy pattern 85 is patterned with a line density per unit area equal to that of the high potential coil 23 in this embodiment. That the line density of the dummy pattern 85 is equal to that of the high potential coil 23 means that the line density of the dummy pattern 85 is within a range of ±20% of the line density of the high potential coil 23.

The dummy pattern 85 is preferably formed in a region adjacent to the high potential coil 23 with respect to the low potential terminal 11 in a plan view. That the dummy pattern 85 is adjacent to the high potential coil 23 in a plan view means that the distance between the dummy pattern 85 and the high potential coil 23 is less than the distance between the dummy pattern 85 and the low potential terminal 11.

The depth position of the dummy pattern 85 in the insulation layer 51 is arbitrary and is adjusted in accordance with the electric field intensity to be mitigated. The dummy pattern 85 is preferably formed in a region adjacent to the high potential coil 23 with respect to the low potential coil 22 in the normal direction Z. That the dummy pattern 85 is adjacent to the high potential coil 23 in the normal direction Z means that the distance between the dummy pattern 85 and the high potential coil 23 in the normal direction Z is less than the distance between the dummy pattern 85 and the low potential coil 22.

In this case, concentration of electric field on the high potential coil 23 can be appropriately suppressed. In the normal direction Z, as the distance between the dummy pattern 85 and the high potential coil 23 is made smaller, concentration of electric field on the high potential coil 23 can be suppressed more. The dummy pattern 85 is preferably formed in the same interlayer insulation layer 57 as the high potential coil 23. In this case, concentration of electric field on the high potential coil 23 can be suppressed more appropriately.

The dummy pattern 85 is preferably formed around the plurality of high potential coils 23 so as to be in the region between the plurality of neighboring high potential coils 23 in a plan view. In this case, using the region between the plurality of neighboring high potential coils 23, undesired concentration of electric field on the plurality of high potential coils 23 can be suppressed.

The dummy pattern 85 is preferably in the region between the low potential terminal 11 and the high potential coil 23 in a plan view. In this case, undesired continuity between the low potential terminal 11 and the high potential coil 23 due to concentration of electric field on the high potential coil 23 can be suppressed. The dummy pattern 85 is preferably in the region between the low potential terminal 11 and the high potential terminal 12 in a plan view. In this case, undesired continuity between the low potential terminal 11 and the high potential terminal 12 due to concentration of electric field on the high potential coil 23 can be suppressed.

The dummy pattern 85 is formed along the plurality of high potential coils 23 in a plan view in this embodiment, and is in the region between the plurality of neighboring high potential coils 23. In addition, the dummy pattern 85 surrounds the region including the plurality of high potential coils 23 and the plurality of high potential terminals 12 as a whole in a plan view. In addition, the dummy pattern 85 is in the region between the plurality of low potential terminals 11A to 11F and the plurality of high potential coils 23 in a plan view. In addition, the dummy pattern 85 is in the region between the plurality of low potential terminals 11A to 11F and the plurality of high potential terminals 12A to 12F in a plan view.

With reference to FIGS. 12 to 17, the dummy pattern 85 includes a plurality of dummy patterns having different electrical states. The dummy pattern 85 includes a high potential dummy pattern 86. The high potential dummy pattern 86 is formed in the insulation layer 51 so as to be positioned around the transformers 21A to 21D in a plan view. The high potential dummy pattern 86 is formed in a pattern (discontinuous pattern) different from that of the high potential coil 23 or the low potential coil 22, and is independent of the transformers 21A to 21D. In other words, the high potential dummy pattern 86 does not function as the transformers 21A to 21D.

The high potential dummy pattern 86 is patterned in dense lines so as to partially cover and partially expose the region around the high potential coil 23 in a plan view in this embodiment. The high potential dummy pattern 86 is patterned with a line density per unit area equal to that of the high potential coil 23 in this embodiment. That the line density of the high potential dummy pattern 86 is equal to that of the high potential coil 23 means that the line density of the high potential dummy pattern 86 is within a range of ±20% of the line density of the high potential coil 23.

The high potential dummy pattern 86 shields electric field between the low potential coil 22 and the high potential coil 23 in the transformers 21A to 21D, and suppresses concentration of electric field on the high potential coil 23. Specifically, the high potential dummy pattern 86 shields electric field between the low potential coil 22 and the high potential coil 23 so as to keep the electric field leaking to the upper side of the high potential coil 23 away from the high potential coil 23. In this way, concentration of electric field on the high potential coil 23 due to the electric field leaking to the upper side of the high potential coil 23 is suppressed.

The high potential dummy pattern 86 is applied with a voltage higher than that applied to the low potential coil 22. In this way, a voltage drop between the high potential coil 23 and the high potential dummy pattern 86 can be suppressed, and hence concentration of electric field on the high potential coil 23 can be suppressed. The high potential dummy pattern 86 is preferably applied with the voltage that is applied to the high potential coil 23. In other words, the high potential dummy pattern 86 is preferably is fixed to the same potential as the high potential coil 23. In this way, a voltage drop between the high potential coil 23 and the high potential dummy pattern 86 can be securely suppressed, and hence concentration of electric field on the high potential coil 23 can be appropriately suppressed.

The depth position of the high potential dummy pattern 86 in the insulation layer 51 is arbitrary and is adjusted in accordance with the electric field intensity to be mitigated. The high potential dummy pattern 86 is preferably formed in a region adjacent to the high potential coil 23 with respect to the low potential coil 22 in the normal direction Z. That the high potential dummy pattern 86 is adjacent to the high potential coil 23 in the normal direction Z means that the distance between the high potential dummy pattern 86 and the high potential coil 23 in the normal direction Z is less than the distance between the high potential dummy pattern 86 and the low potential coil 22.

In this case, concentration of electric field on the high potential coil 23 can be appropriately suppressed. In the normal direction Z, as the distance between the high potential dummy pattern 86 and the high potential coil 23 is made smaller, concentration of electric field on the high potential coil 23 can be suppressed more. The high potential dummy pattern 86 is preferably formed in the same interlayer insulation layer 57 as the high potential coil 23. In this case, concentration of electric field on the high potential coil 23 can be suppressed more appropriately.

The high potential dummy pattern 86 is preferably formed in a region adjacent to the high potential coil 23 with respect to the low potential terminal 11 in a plan view. That the high potential dummy pattern 86 is adjacent to the high potential coil 23 in a plan view means that the distance between the high potential dummy pattern 86 and the high potential coil 23 is less than the distance between the high potential dummy pattern 86 and low potential terminal 11.

The high potential dummy pattern 86 is preferably formed around the plurality of high potential coils 23 so as to be in the region between the plurality of neighboring high potential coils 23 in a plan view. In this case, using the region between the plurality of neighboring high potential coils 23, undesired concentration of electric field on the plurality of high potential coils 23 can be suppressed.

The high potential dummy pattern 86 is preferably in the region between the low potential terminal 11 and the high potential coil 23 in a plan view. In this case, undesired continuity between the low potential terminal 11 and the high potential coil 23 due to concentration of electric field on the high potential coil 23 can be suppressed. The high potential dummy pattern 86 is preferably in the region between the low potential terminal 11 and the high potential terminal 12 in a plan view. In this case, undesired continuity between the low potential terminal 11 and the high potential terminal 12 due to concentration of electric field on the high potential coil 23 can be suppressed.

The high potential dummy pattern 86 is formed along the plurality of high potential coils 23 in a plan view in this embodiment, and is in the region between the plurality of neighboring high potential coils 23. In addition, the high potential dummy pattern 86 surrounds the region including the plurality of high potential coils 23 and the plurality of high potential terminals 12 as a whole in a plan view. In addition, the high potential dummy pattern 86 is in the region between the plurality of low potential terminals 11A to 11F and the plurality of high potential coils 23 in a plan view. In addition, the high potential dummy pattern 86 is in the region between the plurality of low potential terminals 11A to 11F and the plurality of high potential terminals 12A to 12F in a plan view.

The high potential dummy pattern 86 is patterned around the high potential terminals 12E and 12F so as to expose a region just below the high potential terminals 12E and 12F in the region between the plurality of neighboring high potential coils 23 in a plan view. A part of the high potential dummy pattern 86 may face the high potential terminals 12A to 12F in the normal direction Z. In this case, similarly to the high potential dummy pattern 86, the high potential terminals 12E and 12F shield electric field so as to suppress the electric field leaking to the upper side of the high potential coil 23. In other words, the high potential terminals 12E and 12F are formed as the shield conductor layer to suppress concentration of electric field on the high potential coil 23 together with the high potential dummy pattern 86.

The high potential dummy pattern 86 is preferably formed to have an end. In this case, formation of a current loop circuit (a closed circuit) in the high potential dummy pattern 86 can be suppressed. In this way, noise due to current flowing in the high potential dummy pattern 86 is suppressed. As a result, undesired concentration of electric field due to noise can be suppressed, and simultaneously variation in electrical characteristics of the transformers 21A to 21D can be suppressed.

Specifically, the high potential dummy pattern 86 includes a first high potential dummy pattern 87 and a second high potential dummy pattern 88. The first high potential dummy pattern 87 is formed in the region between the plurality of neighboring transformers 21A to 21D (the plurality of neighboring high potential coils 23) in a plan view. The second high potential dummy pattern 88 is formed in the region outside the region between the plurality of neighboring transformers 21A to 21D (the plurality of high potential coils 23) in a plan view.

In the following description, the region between the neighboring first transformer 21A (the high potential coil 23) and second transformer 21B (the high potential coil 23) is referred to as a first region 89. In addition, the region between the second transformer 21B (the high potential coil 23) and the third transformer 21C (the high potential coil 23) is referred to as a second region 90. In addition, the region between the third transformer 21C (the high potential coil 23) and the fourth transformer 21D (the high potential coil 23) is referred to as a third region 91.

In this embodiment, the first high potential dummy pattern 87 is electrically connected to the high potential terminal 12 (the fifth high potential terminal 12E) via the first high potential wiring 33. Specifically, the first high potential dummy pattern 87 includes a first connection part 92 connected to the first high potential wiring 33. The position of the first connection part 92 is arbitrary. In this way, the first high potential dummy pattern 87 is fixed to the same potential as the plurality of high potential coils 23.

Specifically, the first high potential dummy pattern 87 includes a first pattern 93 formed in the first region 89, a second pattern 94 formed in the second region 90, and a third pattern 95 formed in the third region 91. In this way, the first high potential dummy pattern 87 suppresses the electric field leaking to the upper side of the high potential coil 23 in the first region 89, the second region 90, and the third region 91, so as to suppress concentration of electric field on the plurality of neighboring high potential coils 23.

In this embodiment, the first pattern 93, the second pattern 94, and the third pattern 95 are formed as a unit and is fixed to the same potential. The first pattern 93, the second pattern 94, and the third pattern 95 may be separated from each other as long as they are fixed to the same potential.

With reference to FIGS. 12 and 15, the first pattern 93 is connected to the first high potential wiring 33 via the first connection part 92. The first pattern 93 is patterned in dense lines so as to cover and hide a part region of the first region 89 in a plan view. The first pattern 93 is formed in the first region 89 with a space from the high potential terminal 12 (the fifth high potential terminal 12E) in a plan view, and does not face the high potential terminal 12 in the normal direction Z. In addition, the first pattern 93 is formed with a space from the low potential connection wiring 72 in a plan view, and does not face the low potential connection wiring 72 in the normal direction Z. In this way, the insulation distance between the first pattern 93 and the low potential connection wiring 72 is increased, and the dielectric voltage of the insulation layer 51 is enhanced.

The first pattern 93 includes a first outer circumference line 96, a second outer circumference line 97, and a plurality of first middle lines 98. The first outer circumference line 96 extends in a belt-like shape along the periphery of the high potential coil 23 of the first transformer 21A. The first outer circumference line 96 is formed in a ring shape with an open end in the first region 89 in a plan view in this embodiment. The open end width of the first outer circumference line 96 is less than the width of the high potential coil 23 in the second direction Y.

The width of the first outer circumference line 96 may be 0.1 µm or more and 5 µm or less. The width of the first outer circumference line 96 is preferably 1 µm or more and 3 µm or less. The width of the first outer circumference line 96 is defined by the width in a direction perpendicular to the extending direction of the first outer circumference line 96. The width of the first outer circumference line 96 is preferably equal to the width of the high potential coil 23. That the width of the first outer circumference line 96 is equal to the width of the high potential coil 23 means that the width of the first outer circumference line 96 is within a range of ±20% of the width of the high potential coil 23.

A first pitch between the first outer circumference line 96 and the high potential coil 23 (the first transformer 21A) may be 0.1 µm or more and 5 µm or less. The first pitch is preferably 1 µm or more and 3 µm or less. The first pitch is preferably equal to the second winding pitch of the high potential coil 23. That the first pitch is equal to the first winding pitch means that the first pitch is within a range of ±20% of the first winding pitch.

The second outer circumference line 97 extends in a belt-like shape along the periphery of the high potential coil 23 of the second transformer 21B. The second outer circumference line 97 is formed in a ring shape with an open end in the first region 89 in a plan view in this embodiment. The open end width of the second outer circumference line 97 is less than the width of the high potential coil 23 in the second direction Y. The open end width of the second outer circumference line 97 faces the open end of the first outer circumference line 96 in the first direction X.

The width of the second outer circumference line 97 may be 0.1 µm or more and 5 µm or less. The width of the second outer circumference line 97 is preferably 1 µm or more and 3 µm or less. The width of the second outer circumference line 97 is defined by the width in a direction perpendicular to the extending direction of the second outer circumference line 97. The width of the second outer circumference line 97 is preferably equal to the width of the high potential coil 23. That the width of the second outer circumference line 97 is equal to the width of the high potential coil 23 means that the width of the second outer circumference line 97 is within a range of ±20% of the width of the high potential coil 23.

A second pitch between the second outer circumference line 97 and the high potential coil 23 (the second transformer 21B) may be 0.1 µm or more and 5 µm or less. The second pitch is preferably 1 µm or more and 3 µm or less. The second pitch is preferably equal to the second winding pitch of the high potential coil 23. That the second pitch is equal to the second winding pitch means that the second pitch is within a range of ±20% of the second winding pitch.

The plurality of first middle lines 98 extend in a belt-like shape in the region between the first outer circumference line 96 and the second outer circumference line 97 in the first region 89. The plurality of first middle lines 98 include at least one (in this embodiment, one) first connection line 99 that electrically connects the first outer circumference line 96 and the second outer circumference line 97.

In view of preventing formation of a current loop circuit, the plurality of first middle lines 98 preferably include only one first connection line 99. The position of the first connection line 99 is arbitrary. At least one of the plurality of first middle lines 98 is provided with a slit 100 that cuts off a current loop circuit. The position of the slit 100 is appropriately adjusted by design of the plurality of first middle lines 98.

The plurality of first middle lines 98 is preferably formed in a belt-like shape extending in the facing direction of the plurality of high potential coils 23. The plurality of first middle lines 98 are formed in a belt-like shape extending in the first direction X in this embodiment, and are formed with spaces in the second direction Y. The plurality of first middle lines 98 are formed in a stripe shape extending in the first direction X as a whole in a plan view.

Specifically, the plurality of first middle lines 98 include a plurality of first lead parts 101 and a plurality of second lead parts 102. The plurality of first lead parts 101 are led out in a stripe shape from the first outer circumference line 96 to the second outer circumference line 97. Tips of the plurality of first lead parts 101 are formed with spaces from the first outer circumference line 96 toward the second outer circumference line 97.

The plurality of second lead parts 102 are led out from the second outer circumference line 97 to the first outer circumference line 96 in a stripe shape. Tips of the plurality of second lead parts 102 are formed with spaces from the second outer circumference line 97 toward the first outer circumference line 96. The plurality of second lead parts 102 are formed so as to sandwich one first lead part 101, alternately with the plurality of first lead parts 101 in the second direction Y with spaces in this embodiment.

The plurality of second lead parts 102 may sandwich the plurality of first lead parts 101. In addition, a group of the plurality of second lead parts 102 may be formed to be adjacent to a group of the plurality of first lead parts 101. The slit 100, the plurality of first lead parts 101, and the plurality of second lead parts 102 suppress formation of a current loop circuit in the first pattern 93.

In the second direction Y, the width of the first middle line 98 may be 0.1 µm or more and 5 µm or less. The width of the first middle line 98 is preferably 1 µm or more and 3 µm or less. The width of the first middle line 98 is preferably equal to the width of the high potential coil 23. That the width of the first middle line 98 is equal to the width of the high potential coil 23 means that the width of the first middle line 98 is within a range of ±20% of the width of the high potential coil 23.

A third pitch between the two neighboring first middle line 98 may be 0.1 µm or more and 5 µm or less. The third pitch is preferably 1 µm or more and 3 µm or less. The third pitch is defined by a distance between the plurality of neighboring first middle lines 98 in the second direction Y. The third pitches are preferably equal to each other. That the third pitches are equal to each other means that the third pitch is within a range of ±20% of the third pitch. The third pitch is preferably equal to the second winding pitch of the high potential coil 23. That the third pitch is equal to the second winding pitch means that the third pitch is within a range of ±20% of the second winding pitch.

With reference to FIGS. 12 and 16, the second pattern 94 is electrically connected to the high potential terminal 12 via the first high potential wiring 33. The second pattern 94 is electrically connected to the first high potential wiring 33 (the fifth high potential terminal 12E) via the second outer circumference line 97 of the first pattern 93 in this embodiment. The second pattern 94 is patterned in dense lines so as to cover and hide the second region 90.

The second pattern 94 includes the second outer circumference line 97, a third outer circumference line 103, and a plurality of second middle lines 104. The third outer circumference line 103 extends in a belt-like shape along the periphery of the high potential coil 23 of the third transformer 21C. The third outer circumference line 103 is formed in a ring shape with an open end in the third region 91 in a plan view in this embodiment. The open end width of the third outer circumference line 103 is less than the width of high potential coil 23 of the third transformer 21C in the second direction Y.

The width of the third outer circumference line 103 may be 0.1 µm or more and 5 µm or less. The width of the third outer circumference line 103 is preferably 1 µm or more and 3 µm or less. The width of the third outer circumference line 103 is defined by the width in a direction perpendicular to the extending direction of the third outer circumference line 103. The width of the third outer circumference line 103 is preferably equal to the width of the high potential coil 23. That the width of the third outer circumference line 103 is equal to the width of the high potential coil 23 means that the width of the third outer circumference line 103 is within a range of ±20% of the width of the high potential coil 23.

A fourth pitch between the third outer circumference line 103 and the high potential coil 23 (the third transformer 21C) may be 0.1 µm or more and 5 µm or less. The fourth pitch is preferably 1 µm or more and 3 µm or less. The fourth pitch is preferably equal to the second winding pitch of the high potential coil 23. That the fourth pitch is equal to the second winding pitch means that the fourth pitch is within a range of ±20% of the second winding pitch.

The plurality of second middle lines 104 extend in a belt-like shape in the region between the second outer circumference line 97 and the third outer circumference line 103 in the second region 90. The plurality of second middle lines 104 include at least one (in this embodiment, one) second connection line 105 that electrically connects the second outer circumference line 97 and the third outer circumference line 103.

In view of preventing formation of a current loop circuit, the plurality of second middle lines 104 preferably include only one second connection line 105. The second connection line 105 may have a width more than the width of another second middle line 104. The position of the second connection line 105 is arbitrary. At least one of the plurality of second middle lines 104 is provided with a slit 106 that cuts off a current loop circuit. The position of the slit 106 is appropriately adjusted by design of the plurality of second middle lines 104.

The plurality of second middle lines 104 are preferably formed in a belt-like shape extending in the facing direction of the plurality of high potential coils 23. The plurality of second middle lines 104 are formed in a belt-like shape extending in the first direction X in this embodiment, and are formed with spaces in the second direction Y. The plurality of second middle lines 104 are formed in a stripe shape as a whole extending in the first direction X in a plan view.

Specifically, the plurality of second middle lines 104 include a plurality of third lead parts 107 and a plurality of fourth lead parts 108. The plurality of third lead parts 107 are led out in a stripe shape from the second outer circumference line 97 to the third outer circumference line 103. Tips of the plurality of third lead parts 107 are formed with spaces from the third outer circumference line 103 toward the second outer circumference line 97.

The plurality of fourth lead parts 108 are led out in a stripe shape from the third outer circumference line 103 to the second outer circumference line 97. Tips of the plurality of fourth lead parts 108 are formed with spaces from the second outer circumference line 97 toward the third outer circumference line 103. The plurality of fourth lead parts 108 are formed so as to sandwich one third lead part 107, alternately with the plurality of third lead parts 107 in the second direction Y with spaces in this embodiment.

The plurality of fourth lead parts 108 may sandwich the plurality of third lead parts 107. In addition, a group of the plurality of fourth lead parts 108 may be formed to be adjacent to a group of the plurality of third lead parts 107. The slit 106, the plurality of third lead parts 107, and the plurality of fourth lead parts 108 suppress formation of a current loop circuit in the second pattern 94.

In the second direction Y, the width of the second middle line 104 may be 0.1 µm or more and 5 µm or less. The width of the second middle line 104 is preferably 1 µm or more and 3 µm or less. The width of the second middle line 104 is preferably equal to the width of the high potential coil 23. That the width of the second middle line 104 is equal to the width of the high potential coil 23 means that the width of the second middle line 104 is within a range of ±20% of the width of the high potential coil 23.

A fifth pitch between the two neighboring second middle lines 104 may be 0.1 µm or more and 5 µm or less. The fifth pitch is preferably 1 µm or more and 3 µm or less. The fifth pitch is defined by the distance between the plurality of neighboring second middle lines 104 in the second direction Y. The fifth pitches are preferably equal to each other. That the fifth pitches are equal to each other means that the fifth pitch is within a range of ±20% of the fifth pitch. The fifth pitch is preferably equal to the second winding pitch of the high potential coil 23. That the fifth pitch is equal to the second winding pitch means that the fifth pitch is within a range of ±20% of the second winding pitch.

With reference to FIGS. 12 and 17, the third pattern 95 is electrically connected to the first high potential wiring 33. The third pattern 95 is electrically connected to the first high potential wiring 33 via the second pattern 94 and the first pattern 93 in this embodiment. The third pattern 95 is patterned in dense lines so as to cover and hide a part region of the third region 91. The third pattern 95 is formed in the third region 91 with a space from the high potential terminal 12 (the sixth high potential terminal 12F) in a plan view, and does not face the high potential terminal 12 in the normal direction Z.

The third pattern 95 is formed with a space from the low potential connection wiring 72 in a plan view, and does not face the low potential connection wiring 72 in the normal direction Z. In this way, in the normal direction Z, the insulation distance between the third pattern 95 and the low potential connection wiring 72 is increased, and the dielectric voltage of the insulation layer 51 is enhanced.

The third pattern 95 includes the third outer circumference line 103, a fourth outer circumference line 109 and a plurality of third middle lines 110. The fourth outer circumference line 109 extends in a belt-like shape along the periphery of the high potential coil 23 of the fourth transformer 21D. The fourth outer circumference line 109 is formed in a ring shape with an open end in the third region 91 in a plan view in this embodiment. The open end width of the fourth outer circumference line 109 is less than the width of the high potential coil 23 of the fourth transformer 21D in the second direction Y. The open end of the fourth outer circumference line 109 faces the open end of the third outer circumference line 103 in the first direction X.

The width of the fourth outer circumference line 109 may be 0.1 µm or more and 5 µm or less. The width of the fourth outer circumference line 109 is preferably 1 µm or more and 3 µm or less. The width of the fourth outer circumference line 109 is defined by the width in a direction perpendicular to the extending direction of the fourth outer circumference line 109. The fourth outer circumference line 109 is preferably equal to the width of the high potential coil 23. That the width of the fourth outer circumference line 109 is equal to the width of the high potential coil 23 means that the width of the fourth outer circumference line 109 is within a range of ±20% of the width of the high potential coil 23.

A sixth pitch between the fourth outer circumference line 109 and the high potential coil 23 (the fourth transformer 21D) may be 0.1 µm or more and 5 µm or less. The sixth pitch is preferably 1 µm or more and 3 µm or less. This means that the sixth pitch is equal to the second winding pitch of the high potential coil 23. That the sixth pitch is equal to the second winding pitch means that the sixth pitch is within a range of ±20% of the second winding pitch.

The plurality of third middle lines 110 extend in a belt-like shape in the region between the third outer circumference line 103 and the fourth outer circumference line 109 in the third region 91. The plurality of third middle lines 110 include at least one (in this embodiment, one) third connection line 111 that electrically connects the third outer circumference line 103 and the fourth outer circumference line 109.

In view of preventing formation of a current loop circuit, the plurality of third middle lines 110 preferably include only one third connection line 111. The position of the third connection line 111 is arbitrary. At least one of the plurality of third middle lines 110 is provided with a slit 112 that cuts off a current loop circuit. The position of the slit 112 is appropriately adjusted by design of the plurality of third middle lines 110.

The plurality of third middle lines 110 are preferably formed in a belt-like shape extending in the facing direction of the plurality of high potential coils 23. The plurality of third middle lines 110 are formed in a belt-like shape extending in the first direction X in this embodiment, and are formed with spaces in the second direction Y. The plurality of third middle lines 110 are formed in a stripe shape as a whole in a plan view.

The plurality of third middle lines 110 include a plurality of fifth lead parts 113 and a plurality of sixth lead parts 114 in this embodiment. The plurality of fifth lead parts 113 are led out in a stripe shape from the third outer circumference line 103 to the fourth outer circumference line 109. Tips of the plurality of fifth lead parts 113 are formed with spaces from the fourth outer circumference line 109 toward the third outer circumference line 103.

The plurality of sixth lead parts 114 are led out in a stripe shape from the fourth outer circumference line 109 to the third outer circumference line 103. Tips of the plurality of sixth lead parts 114 are formed with spaces from the third outer circumference line 103 toward the fourth outer circumference line 109. The plurality of sixth lead parts 114 are formed so as to sandwich the fifth lead part 113, alternately with the plurality of fifth lead parts 113 in the second direction Y with spaces in this embodiment.

The plurality of sixth lead parts 114 may sandwich the plurality of fifth lead parts 113. In addition, a group of the plurality of sixth lead parts 114 may be formed to be adjacent to a group of the plurality of fifth lead parts 113. The slit 112, the plurality of fifth lead parts 113, and the plurality of sixth lead parts 114 suppress formation of a current loop circuit in the third pattern 95.

In the second direction Y, the width of the third middle line 110 may be 0.1 µm or more and 5 µm or less. The width of the third middle line 110 is preferably 1 µm or more and 3 µm or less. The width of the third middle line 110 is preferably equal to the width of the high potential coil 23. That the width of the third middle line 110 is equal to the width of the high potential coil 23 means that the width of the third middle line 110 is within a range of ±20% of the width of the high potential coil 23.

A seventh pitch between the two neighboring third middle line 110 may be 0.1 µm or more and 5 µm or less. The seventh pitch is preferably 1 µm or more and 3 µm or less. The seventh pitch is defined by the distance between the plurality of neighboring third middle lines 110 in the second direction Y. The seventh pitches are preferably equal to each other. That the seventh pitches are equal to each other means that the seventh pitch is within a range of ±20% of the seventh pitch. The seventh pitch is preferably equal to the second winding pitch of the high potential coil 23. That the seventh pitch is equal to the second winding pitch means that the seventh pitch is within a range of ±20% of the second winding pitch.

With reference to FIGS. 12 to 17, the second high potential dummy pattern 88 is electrically connected to the high potential terminal 12 via the first high potential dummy pattern 87 in this embodiment. Specifically, the second high potential dummy pattern 88 includes a second connection part 115 connected to the first high potential dummy pattern 87. The position of the second connection part 115 is arbitrary. In this way, the second high potential dummy pattern 88 is fixed to the same potential as the plurality of high potential coils 23.

The second high potential dummy pattern 88 suppress the electric field leaking to the upper side of the high potential coil 23 in a region outside the first region 89, the second region 90, and the third region 91, and suppresses concentration of electric field on the plurality of high potential coils 23. The second high potential dummy pattern 88 surrounds the region including the plurality of high potential coils 23 and the plurality of high potential terminals 12A to 12F as a whole in a plan view in this embodiment. The second high potential dummy pattern 88 is formed in an elliptical (oval) ring shape in a plan view in this embodiment.

In this way, the second high potential dummy pattern 88 is in the region between the plurality of low potential terminals 11A to 11F and the plurality of high potential coils 23, in a plan view. In addition, the second high potential dummy pattern 88 is in the region between the plurality of low potential terminals 11A to 11F and the plurality of high potential terminals 12A to 12F in a plan view.

The second high potential dummy pattern 88 includes a plurality of (in this embodiment, six) high potential lines 116A, 116B, 116C, 116D, 116E, and 116F. The number of the high potential lines is adjusted in accordance with the electric field to be mitigated. The plurality of high potential lines 116A to 116F are formed with spaces in order in a direction separating from the plurality of high potential coils 23.

The plurality of high potential lines 116A to 116F surround the plurality of high potential coils 23 as a whole in a plan view. Specifically, the plurality of high potential lines 116A to 116F surround the region including the plurality of high potential coils 23 and the plurality of high potential terminals 12A to 12F as a whole in a plan view. The plurality of high potential lines 116A to 116F are formed in an elliptical (oval) ring shape in a plan view in this embodiment.

The plurality of high potential lines 116A to 116F each include a slit 117 that cuts off a current loop circuit. The position of the slit 117 is appropriately adjusted by design of the plurality of high potential lines 116A to 116F.

The width of the high potential lines 116A to 116F may be 0.1 μm or more and 5 μm or less. The width of the high potential lines 116A to 116F is preferably 1 μm or more and 3 μm or less. The width of the high potential lines 116A to 116F is defined by the width in a direction perpendicular to the extending direction of the high potential lines 116A to 116F. The width of the high potential lines 116A to 116F is preferably equal to the width of the high potential coil 23. That the width of the high potential lines 116A to 116F is equal to the width of the high potential coil 23 means that the width of the high potential lines 116A to 116F is within a range of ±20% of the width of the high potential coil 23.

An eighth pitch between the two neighboring high potential lines 116A to 116F may be 0.1 μm or more and 5 μm or less. The eighth pitch is preferably 1 μm or more and 3 μm or less. The eighth pitches are preferably equal to each other. That the eighth pitches are equal to each other means that the eighth pitch is within a range of ±20% of the eighth pitch.

A ninth pitch between the neighboring first high potential dummy pattern 87 and second high potential dummy pattern 88 may be 0.1 μm or more and 5 μm or less. The ninth pitch is preferably 1 μm or more and 3 μm or less. The ninth pitch is preferably equal to the second winding pitch of the high potential coil 23. That the ninth pitch is equal to the second winding pitch means that the ninth pitch is within a range of ±20% of the second winding pitch. The number of the high potential lines 116A to 116F, or the width, pitch, or the like thereof is arbitrary and is adjusted in accordance with the electric field to be mitigated.

With reference to FIGS. 12 to 17, the dummy pattern 85 includes a floating dummy pattern 121 formed in an electrically floating state in the insulation layer 51 so as to be positioned around the transformers 21A to 21D in a plan view. The floating dummy pattern 121 is formed in a pattern (discontinuous pattern) different from the high potential coil 23 and the low potential coil 22, and is independent of the transformers 21A to 21D. In other words, the floating dummy pattern 121 does not function as the transformers 21A to 21D.

The floating dummy pattern 121 is patterned in dense lines so as to partially cover and partially expose the region around the high potential coil 23 in a plan view in this embodiment. The floating dummy pattern 121 may be formed to have an end or may be formed endlessly.

The floating dummy pattern 121 is patterned with a line density per unit area equal to that of the high potential coil 23. That the line density of the floating dummy pattern 121 is equal to that of the high potential coil 23 means that the line density of the floating dummy pattern 121 is within a range of ±20% of the line density of the high potential coil 23.

In addition, the floating dummy pattern 121 is patterned in a line density per unit area equal to that of the high potential dummy pattern 86. That the line density of the floating dummy pattern 121 is equal to that of the high potential dummy pattern 86 means that the line density of the floating dummy pattern 121 is within a range of ±20% of the line density of the high potential dummy pattern 86.

The floating dummy pattern 121 shields electric field between the low potential coil 22 and the high potential coil 23 in the transformers 21A to 21D, so as to suppress concentration of electric field on the high potential coil 23. Specifically, the floating dummy pattern 121 decentralizes the electric field leaking to the upper side of the high potential coil 23 in a direction separating from the high potential coil 23. In this way, concentration of electric field on the high potential coil 23 can be suppressed.

In addition, the floating dummy pattern 121 decentralizes the electric field leaking to the upper side of the high potential dummy pattern 86 around the high potential dummy pattern 86, in a direction separating from the high potential coil 23 and the high potential dummy pattern 86. In this way, concentration of electric field on the high potential dummy pattern 86 can be suppressed, and concentration of electric field on the high potential coil 23 can be appropriately suppressed.

The depth position of the floating dummy pattern 121 in the insulation layer 51 is arbitrary and is adjusted in accordance with the electric field intensity to be mitigated. The floating dummy pattern 121 is preferably formed in a region adjacent to the high potential coil 23 with respect to the low potential coil 22 in the normal direction Z. That the floating dummy pattern 121 is adjacent to the high potential coil 23 in the normal direction Z means that the distance between the floating dummy pattern 121 and the high potential coil 23 is less than the distance between the floating dummy pattern 121 and the low potential coil 22 in the normal direction Z.

In this case, concentration of electric field on the high potential coil 23 can be appropriately suppressed. In the normal direction Z, as the distance between the floating dummy pattern 121 and the high potential coil 23 is made smaller, concentration of electric field on the high potential coil 23 can be suppressed more. The floating dummy pattern 121 is preferably formed in the same interlayer insulation layer 57 as the high potential coil 23. In this case, concentration of electric field on the high potential coil 23 can be suppressed more appropriately.

The floating dummy pattern 121 is preferably in the region between the low potential terminal 11 and the high potential coil 23 in a plan view. In this case, undesired continuity between the low potential terminal 11 and the high potential coil 23 due to concentration of electric field on the high potential coil 23 can be suppressed. The floating dummy pattern 121 is preferably in the region between the low potential terminal 11 and the high potential terminal 12 in a plan view. In this case, undesired continuity between the low potential terminal 11 and the high potential terminal 12 due to concentration of electric field on the high potential coil 23 can be suppressed.

The floating dummy pattern 121 is formed along the plurality of high potential coils 23 in a plan view in this embodiment. Specifically, the floating dummy pattern 121 surrounds the region including the plurality of high potential coils 23 and the plurality of high potential terminals 12 as a whole in a plan view. In this embodiment, the floating dummy pattern 121 surrounds the region including the plurality of high potential coils 23 and the plurality of high potential terminals 12 sandwiching the high potential dummy pattern 86 (the second high potential dummy pattern 88) in a plan view.

In this way, the floating dummy pattern 121 is in the region between the plurality of low potential terminals 11A to 11F and the plurality of high potential coils 23 in a plan view. In addition, the floating dummy pattern 121 is in the region between the plurality of low potential terminals 11A to 11F and the plurality of high potential terminals 12A to 12F in a plan view.

The number of the floating lines is arbitrary and is adjusted in accordance with the electric field to be mitigated. In this embodiment, the floating dummy pattern 121 includes a plurality of (in this embodiment, six) floating lines 122A, 122B, 122C, 122D, 122E, and 122F. The plurality of floating lines 122A to 122F are formed with spaces in order in a direction separating from the plurality of high potential coils 23.

The plurality of floating lines 122A to 122F surround the plurality of high potential coils 23 as a whole in a plan view. Specifically, the plurality of floating lines 122A to 122F surround the region including the plurality of high potential coils 23 and the plurality of high potential terminals 12A to 12F sandwiching the high potential dummy pattern 86 as a whole in a plan view. The plurality of floating lines 122A to 122F are formed in an elliptical (oval) ring shape in a plan view in this embodiment.

The width of the floating lines 122A to 122F may be 0.1 μm or more and 5 μm or less. The width of the floating lines 122A to 122F is preferably 1 μm or more and 3 μm or less. The width of the floating lines 122A to 122F is defined by the width in a direction perpendicular to the extending direction of the floating lines 122A to 122F.

A tenth pitch between two neighboring floating lines 122A to 122F may be 0.1 μm or more and 5 μm or less. The tenth pitch is preferably 1 μm or more and 3 μm or less. The width of the floating lines 122A to 122F is preferably equal to the width of the high potential coil 23. That the width of the floating lines 122A to 122F is equal to the width of the high potential coil 23 means that the width of the floating lines 122A to 122F is within a range of ±20% of the width of the high potential coil 23.

An eleventh pitch between the floating dummy pattern 121 and the high potential dummy pattern 86 (the second high potential dummy pattern 88) may be 0.1 μm or more and 5 μm or less. The eleventh pitch is preferably 1 μm or more and 3 μm or less. The eleventh pitches are preferably equal to each other. That the eleventh pitches are equal to each other means that the eleventh pitch is within a range of ±20% of the eleventh pitch.

The eleventh pitch is preferably equal to the second winding pitch of the high potential coil 23. That the eleventh pitch between floating lines 122A to 122F is equal to the second winding pitch means that the eleventh pitch is within a range of ±20% of the second winding pitch. For clarity, FIGS. 10 to 12 illustrate an example where the eleventh pitch is more than the second winding pitch.

A twelfth pitch between the floating dummy pattern 121 and the high potential dummy pattern 86 is preferably equal to the second winding pitch. That the twelfth pitch is equal to second winding pitch means that the twelfth pitch is within a range of ±20% of the second winding pitch. The number of the plurality of floating lines 122A to 122F, or the width, pitch, or the like thereof is adjusted in accordance with the electric field to be mitigated and is not limited to a particular value.

With reference to FIGS. 13 and 14, the semiconductor device 5 includes a second function device 60 formed on the first principal surface 42 of the semiconductor chip 41 in a device region 62. The second function device 60 is formed utilizing a surface layer part of the first principal surface 42 of the semiconductor chip 41 and/or a region on the first principal surface 42 of the semiconductor chip 41, and is covered with the insulation layer 51 (the bottom insulation layer 55). In FIGS. 8 and 9, the second function device 60 is simplified and shown in a broken line on the surface layer part of the first principal surface 42.

The second function device 60 is electrically connected to the low potential terminal 11 via the low potential wiring, and is electrically connected to the high potential terminal 12 via the high potential wiring. The low potential wiring has the same structure as the first low potential wiring 31 (the second low potential wiring 32), except that it is patterned in the insulation layer 51 so as to connect to the second function device 60. The high potential wiring has the same structure as the first high potential wiring 33 (the second high potential wiring 34), except that it is patterned in the insulation layer 51 so as to connect to the second function device 60. Specific description of the low potential wiring and the high potential wiring of the second function device 60 is omitted.

The second function device 60 may include at least one of a passive device, a semiconductor rectifier device, and a semiconductor switching device. The second function device 60 may include a circuit network in which any two or more devices out of a passive device, a semiconductor rectifier device, and a semiconductor switching device are selectively combined. The circuit network may form a part or the whole of the integrated circuit.

The passive device may include a semiconductor passive device. The passive device may include one of or both of a resistor and a capacitor. The semiconductor rectifier device may include at least one of a pn junction diode, a PIN diode, a zener diode, a Schottky barrier diode, and a fast recovery diode. The semiconductor switching device may include at least one of a bipolar junction transistor (BJT), a metal insulator field effect transistor (MISFET), an insulated gate bipolar junction transistor (IGBT), and a junction field effect transistor (JFET).

With reference to FIGS. 13 and 14, the semiconductor device 5 further includes a sealing conductor 61 embedded in the insulation layer 51. The sealing conductor 61 is embedded in the insulation layer 51 in such a manner like a wall with a space from the insulation side walls 53A to 53D in a plan view, so as to divide the insulation layer 51 into the device region 62 and an outside region 63. The sealing conductor 61 prevents moisture or crack from entering from the outside region 63 to the device region 62.

The device region 62 is a region including the first function device 45 (the plurality of transformers 21), the second function device 60, the plurality of low potential terminals 11, the plurality of high potential terminals 12, the first low potential wiring 31, the second low potential wiring 32, the first high potential wiring 33, the second high potential wiring 34, and the dummy pattern 85. The outside region 63 is a region outside the device region 62.

The sealing conductor 61 is electrically cut off from the device region 62. Specifically, the sealing conductor 61 is electrically cut off from the first function device 45 (the plurality of transformers 21), the second function device 60, the plurality of low potential terminals 11, the plurality of high potential terminals 12, the first low potential wiring 31, the second low potential wiring 32, the first high potential wiring 33, the second high potential wiring 34, and the dummy pattern 85. More specifically, the sealing conductor 61 is fixed to an electrically floating state. The sealing conductor 61 does not form a current path connected to the device region 62.

The sealing conductor 61 is formed in a belt-like shape along the insulation side walls 53A to 53D in a plan view. The sealing conductor 61 is formed in a quadrangular ring shape (specifically, a rectangular ring shape) in a plan view in this embodiment. In this way, the sealing conductor 61 defines the device region 62 in a quadrangular ring shape (specifically, a rectangular ring shape) in a plan view. In addition, the sealing conductor 61 defines the outside region 63 in a quadrangular ring shape (specifically, a rectangular ring shape) that surrounds the device region 62 in a plan view.

Specifically, the sealing conductor 61 includes a top end part on the side of the insulation principal surface 52, a bottom end part on the side of the semiconductor chip 41, and a wall part that extends like a wall between the top end part and the bottom end part. The top end part of the sealing conductor 61 is formed with a space from the insulation principal surface 52 toward the semiconductor chip 41 in this embodiment, and is positioned in the insulation layer 51. The top end part of the sealing conductor 61 is covered with the top insulation layer 56 in this embodiment. The top end part of the sealing conductor 61 may be covered with one or more interlayer insulation layers 57. The top end part of the sealing conductor 61 may be exposed from the top insulation layer 56. The bottom end part of the sealing conductor 61 is formed with a space from the semiconductor chip 41 toward the top end part.

In this way, the sealing conductor 61 is embedded in the insulation layer 51 so as to be positioned on the side of the semiconductor chip 41 with respect to the plurality of low potential terminals 11 and the plurality of high potential terminals 12 in this embodiment. In addition, the sealing conductor 61 faces the first function device 45 (the plurality of transformers 21), the first low potential wiring 31, the second low potential wiring 32, the first high potential wiring 33, the second high potential wiring 34, and the dummy pattern 85 in the direction parallel to the insulation principal surface 52 in the insulation layer 51. The sealing conductor 61 may face a part of the second function device 60 in the direction parallel to the insulation principal surface 52 in the insulation layer 51.

The sealing conductor 61 includes a plurality of sealing plug conductors 64, and one or more (in this embodiment, a plurality of) sealing via conductors 65. The number of the sealing via conductors 65 is arbitrary. The top sealing plug conductor 64 among the plurality of sealing plug conductors 64 forms the top end part of the sealing conductor 61. The plurality of sealing via conductors 65 each form the bottom end part of the sealing conductor 61. The sealing plug conductor 64 and the sealing via conductor 65 are preferably made of the same conductive material as the low potential coil 22. In other words, the sealing plug conductor 64 and the sealing via conductor 65 preferably include the barrier layer and the body layer similarly to the low potential coil 22 or the like.

The plurality of sealing plug conductors 64 are embedded in the plurality of interlayer insulation layers 57, respectively, and are each formed in a quadrangular ring shape (specifically, a rectangular ring shape) surrounding the device region 62 in a plan view. The plurality of sealing plug conductors 64 are laminated from the bottom insulation layer 55 to the top insulation layer 56 so as to connect each other. The number of layers of the plurality of sealing plug conductors 64 is equal to that of the plurality of interlayer insulation layers 57. As a matter of course, one or more sealing plug conductors 64 penetrating the plurality of interlayer insulation layers 57 may be formed.

As long as the plurality of sealing plug conductors 64 collectively form one ring of the sealing conductor 61, it is not necessary that all the plurality of sealing plug conductors 64 are formed in a ring shape. For instance, at least one of the plurality of sealing plug conductors 64 may be formed to have an end. In addition, at least one of the plurality of sealing plug conductors 64 may be divided into a plurality of band-like parts having an end. However, in view of risk of moisture and crack to enter the device region 62, it is preferred that the plurality of sealing plug conductors 64 are formed endlessly (in a ring shape).

The plurality of sealing via conductors 65 are each formed in the region between the semiconductor chip 41 and the sealing plug conductor 64 in the bottom insulation layer 55. The plurality of sealing via conductors 65 are formed with spaces from the semiconductor chip 41, and are connected to the sealing plug conductor 64. The plurality of sealing via conductors 65 have an area less than the area of the sealing plug conductor 64. If the single sealing via conductor 65 is formed, the single sealing via conductor 65 may have an area more than the area of the sealing plug conductor 64.

The width of the sealing conductor 61 may be 0.1 μm or more and 10 μm or less. The width of the sealing conductor 61 is preferably 1 μm or more and 5 μm or less. The width of the sealing conductor 61 is defined by the width in a direction perpendicular to the extending direction of the sealing conductor 61.

With reference to FIGS. 13, 14 and 18, the semiconductor device 5 further includes the separation structure 130 that is between the semiconductor chip 41 and the sealing conductor 61 so as to electrically cut off the sealing conductor 61 from the semiconductor chip 41. The separation structure 130 preferably includes an insulator. The separation structure 130 is constituted of a field insulation film 131 formed on the first principal surface 42 of the semiconductor chip 41 in this embodiment.

The field insulation film 131 includes at least one of an oxide film (a silicon oxide film) and a nitride film (a silicon nitride film). The field insulation film 131 is preferably constituted of a local oxidation of silicon (LOCOS) film as an example of the oxide film formed by oxidation of the first principal surface 42 of the semiconductor chip 41. The thickness of the field insulation film 131 is arbitrary as long as the semiconductor chip 41 and the sealing conductor 61 can be insulated. The thickness of the field insulation film 131 may be 0.1 μm or more and 5 μm or less.

The separation structure 130 is formed on the first principal surface 42 of the semiconductor chip 41, and extends in a belt-like shape along the sealing conductor 61 in a plan view. The separation structure 130 is formed in a quadrangular ring shape (specifically, a rectangular ring shape) in a plan view in this embodiment. The separation structure 130 includes a connection part 132 connected to the bottom end part of the sealing conductor 61 (the sealing via conductor 65). The connection part 132 may form an anchor part as the bottom end part of the sealing conductor 61 (the sealing via conductor 65) that digs into the side of the semiconductor chip 41. As a matter of course, the connection part 132 may be formed to be flush with the principal surface of the separation structure 130.

The separation structure 130 includes an inner end part 130A on the side of the device region 62, an outer end part 130B on the side of the outside region 63, and a main body part 130C between the inner end part 130A and the outer end part 130B. The inner end part 130A defines the region (i.e., the device region 62) in which the second function device 60 is formed, in a plan view. The inner end part 130A may be formed integrally with the insulation film (not shown) formed on the first principal surface 42 of the semiconductor chip 41.

The outer end part 130B is exposed from the chip side walls 44A to 44D of the semiconductor chip 41, and ranges to the chip side walls 44A to 44D of the semiconductor chip 41. Specifically, the outer end part 130B is formed to be flush with the chip side walls 44A to 44D of the semiconductor chip 41. The outer end part 130B forms a flush ground surface between the chip side walls 44A to 44D of the semiconductor chip 41 and the insulation side walls 53A to 53D of the insulation layer 51. As a matter of course, in another embodiment, the outer end part 130B may be formed with spaces from the chip side walls 44A to 44D in the first principal surface 42.

The main body part 130C has a flat surface extending substantially parallel to the first principal surface 42 of the semiconductor chip 41. The main body part 130C includes the connection part 132 connected to the bottom end part of the sealing conductor 61 (the sealing via conductor 65). The connection part 132 is formed in a part with a space from the inner end part 130A and the outer end part 130B in the main body part 130C. The separation structure 130 can have various forms other than the field insulation film 131.

With reference to FIGS. 13 and 14, the semiconductor device 5 further includes an inorganic insulation layer 140 formed on the insulation principal surface 52 of the insulation layer 51 so as to cover the sealing conductor 61. The inorganic insulation layer 140 may be referred to as a passivation layer. The inorganic insulation layer 140 protects the insulation layer 51 and the semiconductor chip 41 on the insulation principal surface 52.

In this embodiment, the inorganic insulation layer 140 has a laminated structure including a first inorganic insulation layer 141 and a second inorganic insulation layer 142. The first inorganic insulation layer 141 may contain silicon oxide. The first inorganic insulation layer 141 preferably contains undoped silicate glass (USG) that is a silicon oxide without impurity. The thickness of the first inorganic insulation layer 141 may be 50 nm or more and 5,000 nm or less. The second inorganic insulation layer 142 may contain silicon nitride. The thickness of the second inorganic insulation layer 142 may be 500 nm or more and 5,000 nm or less. By increasing the total thickness of the inorganic insulation layer 140, the dielectric voltage on the high potential coil 23 can be enhanced.

If the first inorganic insulation layer 141 is made of USG and the second inorganic insulation layer 142 is made of silicon nitride, the dielectric breakdown voltage (V/cm) of USG is higher than that of silicon nitride. Therefore, when thickening the inorganic insulation layer 140, it is preferred that the first inorganic insulation layer 141 having a thickness more than that of the second inorganic insulation layer 142 is formed.

The first inorganic insulation layer 141 may contain at least one of boron doped phosphor silicate glass (BPSG) and phosphorus silicate glass (PSG) as an example of the silicon oxide. However, in this case, as impurity (boron or phosphor) is contained in silicon oxide, it is preferred that the first inorganic insulation layer 141 made of USG is formed, in particular for increasing the dielectric voltage on the high potential coil 23. As a matter of course, the inorganic insulation layer 140 may have a single layer structure constituted of one of the first inorganic insulation layer 141 and the second inorganic insulation layer 142.

The inorganic insulation layer 140 covers the entire region of the sealing conductor 61 and includes a plurality of low potential pad openings 143 and a plurality of high potential pad openings 144 formed in a region outside the sealing conductor 61. The plurality of low potential pad openings 143 expose the plurality of low potential terminals 11, respectively. The plurality of high potential pad openings 144 expose the plurality of high potential terminals 12, respectively. The inorganic insulation layer 140 may include an overlap part that overlaps on a periphery of the low potential terminal 11. The inorganic insulation layer 140 may include an overlap part that overlaps on a periphery of the high potential terminal 12.

The semiconductor device 5 further includes an organic insulation layer 145 formed on the inorganic insulation layer 140. The organic insulation layer 145 may contain photosensitive resin. The organic insulation layer 145 may contain at least one of polyimide, polyamide, and polybenzoxazole. The organic insulation layer 145 contains polyimide in this embodiment. The thickness of the organic insulation layer 145 may be 1 μm or more and 50 μm or less.

The thickness of the organic insulation layer 145 is preferably more than the total thickness of the inorganic insulation layer 140. Moreover, the total thickness of the inorganic insulation layer 140 and the organic insulation layer 145 is preferably more than or equal to the distance D2 between the low potential coil 22 and the high potential coil 23. In this case, the total thickness of the inorganic insulation layer 140 is preferably 2 μm or more and 10 μm or less. In addition, the thickness of the organic insulation layer 145 is preferably 5 μm or more and 50 μm or less. With this structure, thickening of the inorganic insulation layer 140 and the organic insulation layer 145 can be suppressed, and the dielectric voltage on the high potential coil 23 can be appropriately increased by the lamination film of the inorganic insulation layer 140 and the organic insulation layer 145.

The organic insulation layer 145 includes a first part 146 that covers a region on the low potential side and a second part 147 that covers a region on the high potential side. The first part 146 covers the sealing conductor 61 via the inorganic insulation layer 140. The first part 146 includes a plurality of low potential terminal apertures 148 that expose the plurality of low potential terminals 11 (the low potential pad openings 143), respectively, in a region outside the sealing conductor 61. The first part 146 may include an overlap part that overlaps on a periphery (overlap part) of the low potential pad opening 143.

The second part 147 is formed with a space from the first part 146, and exposes the inorganic insulation layer 140 between itself and the first part 146. The second part 147 includes a plurality of high potential terminal apertures 149 that expose the plurality of high potential terminals 12 (the high potential pad opening 144), respectively. The second part 147 may include an overlap part that overlaps on a periphery (overlap part) of the high potential pad opening 144.

The second part 147 covers the transformers 21A to 21D and the dummy pattern 85 as a whole. Specifically, the second part 147 covers the plurality of high potential coils 23, the plurality of high potential terminals 12, the first high potential dummy pattern 87, the second high potential dummy pattern 88, and the floating dummy pattern 121 as a whole.

If the organic insulation layer 145 is not formed, a filler contained in a package main body 2 (mold resin) may cause a damage to the plurality of high potential coils 23, the plurality of high potential terminals 12, the sealing conductor 61, first high potential dummy pattern 87, the second high potential dummy pattern 88, or the floating dummy pattern 121. This type of damage is referred to as a filler attack.

The organic insulation layer 145 protects the plurality of high potential coils 23, the plurality of high potential terminals 12, the sealing conductor 61, first high potential dummy pattern 87, the second high potential dummy pattern 88, and the floating dummy pattern 121, from filler contained in the package main body 2 (mold resin). The slit between the first part 146 and the second part 147 functions as an anchor part for the package main body 2 (mold resin).

A part of the package main body 2 (mold resin) enters the slit between the first part 146 and the second part 147, and is connected to the inorganic insulation layer 140. In this way, adhesion of the package main body 2 (mold resin) to the semiconductor device 5 can be enhanced. As a matter of course, the first part 146 and the second part 147 may be integrally formed. In addition, the organic insulation layer 145 may include only one of the first part 146 and the second part 147. In this case, however, the filler attack should be noted.

The embodiment of the present invention can be implemented in still another form. The embodiment described above shows an example in which the first function device 45 and the second function device 60 are formed. However, it may possible to adopt a form that does not include the first function device 45 but includes only the second function device 60. In this case, the dummy pattern 85 may be removed. With this structure, it is possible to achieve the same effect of the second function device 60 described in the first embodiment (except the effect of the dummy pattern 85).

In other words, when a voltage is applied to the second function device 60 via the low potential terminal 11 and the high potential terminal 12, undesired continuity between the high potential terminal 12 and the sealing conductor 61 can be suppressed. In addition, when a voltage is applied to the second function device 60 via the low potential terminal 11 and the high potential terminal 12, undesired continuity between the low potential terminal 11 and the sealing conductor 61 can be suppressed.

In addition, the embodiment described above shows an example in which the second function device 60 is formed. However, the second function device 60 is not always necessary, but may be removed.

In addition, the embodiment described above shows an example in which the dummy pattern 85 is formed. However, the dummy pattern 85 is not always necessary, but may be removed.

In addition, the embodiment described above shows an example in which the first function device 45 is a multi-channel type including the plurality of transformers 21. However, it may be possible to adopt a single channel type of the first function device 45 including the single transformer 21.

SUMMARY

The various embodiments described above are summarized below.

For instance, the signal transmission device disclosed in this specification has a structure including a first pulse detector arranged to receive a differential input between a first reception pulse signal at a secondary winding of a first transformer and a second reception pulse signal at a secondary winding of a second transformer; a second pulse detector arranged to receive the differential input between the first reception pulse signal and the second reception pulse signal with input polarity reversed to that of the first pulse detector; and a logic unit arranged to generate a reception pulse signal based on output signals of the first pulse detector and the second pulse detector (first structure).

Note that the pulse receiving circuit of the first structure described above may have a structure in which the first pulse detector and the second pulse detector are each a comparator having an input offset (second structure).

In addition, the pulse receiving circuit of the first or second structure may have a structure further including a first switch and a second switch connected between both ends of the secondary windings of the first transformer and the second transformer, respectively; and a timer to turn on the first switch and the second switch for a predetermined masking period from pulse detection timings of the first pulse detector and the second pulse detector, respectively (third structure).

In addition, the pulse receiving circuit of any one of the first to third structures may have a structure further including a first electrostatic protection element and a second electrostatic protection element connected between both ends of the secondary windings of the first transformer and the second transformer, respectively (fourth structure).

In addition, the pulse receiving circuit of any one of the first to fourth structures may have a structure in which the logic unit sets the reception pulse signal to a first logic level according to the first reception pulse signal, and sets the reception pulse signal to a second logic level according to the second reception pulse signal (fifth structure).

In addition, for example, the signal transmission device disclosed in this specification has a structure including a pulse transmission circuit arranged to generate a first transmission pulse signal and a second transmission pulse signal according to an input pulse signal; a first transformer and a second transformer arranged to isolate between input and output and to respectively transmit the first transmission pulse signal and the second transmission pulse signal as a first reception pulse signal and a second reception pulse signal to poststage; the pulse receiving circuit of any one of the first to fifth structures, arranged to generate the reception pulse signal according to the first reception pulse signal and the second reception pulse signal; and a driver arranged to generate an output pulse signal according to the reception pulse signal (sixth structure).

In addition, the signal transmission device of the sixth structure may have a structure in which the pulse transmission circuit performs pulse drive of either one of the first transmission pulse signal and the second transmission pulse signal according to a logic level of the input pulse signal (seventh structure).

In addition, the signal transmission device of the sixth or seventh structure may have a structure in which the pulse transmission circuit is integrated in a first chip, the pulse receiving circuit and the driver are integrated in a second chip, and the first transformer and the second transformer are integrated in a third chip (eighth structure).

In addition, the signal transmission device of the eighth structure described above may have a structure in which the third chip includes a first terminal connected to a first terminal of a primary winding forming the first transformer; a second terminal connected to a second terminal of a primary winding forming the first transformer and a first terminal of a primary winding forming the second transformer; a third terminal connected to a second terminal of a primary winding forming the second transformer; a fourth terminal connected to a first terminal of a secondary winding forming the first transformer; a fifth terminal connected to a second terminal of the secondary winding forming the first transformer and a first terminal of a secondary winding forming the second transformer; and a sixth terminal connected to a second terminal of the secondary winding forming the second transformer (ninth structure).

In addition, the signal transmission device of any one of the sixth to ninth structures may have a structure including a plurality of sets of the first transformer and the second transformer (tenth structure).

<Other Variations>

In addition, the various technical features disclosed in this specification are not limited to the embodiments described above, but can be variously modified within the scope of the technical creation without deviating from the spirit thereof. For instance, a bipolar transistor and a MOS field-effect transistor can be replaced with each other, and logic levels of various signals can be inverted. In other words, the embodiments described above are examples in every aspect, and should not be interpreted as limitations. The technical scope of the present invention is not limited to the embodiments described above, but should be understood to include all modifications within meaning and scope equivalent to the claims.

INDUSTRIAL APPLICABILITY

The invention disclosed in this specification can be used, for example, in general applications (such as an isolated gate driver that handles high voltages, a motor driver, an isolator, or other ICs), which need to transmit signals while electrically isolating between input and output.

LIST OF REFERENCE SIGNS 5 semiconductor device
11 low potential terminal
12 high potential terminal
21 transformer
22 low potential coil
23 high potential coil
41 semiconductor chip
42 first principal surface
44A first chip side wall
44B second chip side wall
44C third chip side wall
44D fourth chip side wall
45 first function device
51 insulation layer
53A first insulation side wall
53B second insulation side wall
53C third insulation side wall
53D fourth insulation side wall
60 second function device
61 sealing conductor
85 dummy pattern
130 separation structure
131 field insulation film
140 inorganic insulation layer
145 organic insulation layer
200 signal transmission device
210 controller chip (first chip)
211, 211A, 211B, 211(1), 211(2) Schmitt buffer
211C AND gate
212 pulse transmission circuit
212a logic unit
212b, 212c buffer
212d, 212e diode (electrostatic protection element)
213 low voltage protection circuit
220 driver chip (second chip)
221 pulse receiving circuit
221a, 221b diode (electrostatic protection element)
221c, 221d, 221e, 221f buffer
221g, 221h delay unit
221i, 221j AND gate
221k logic unit
221A, 221B diode (electrostatic protection element)
221C, 221D N-channel type MOS field-effect transistor (switch)
221E, 221F comparator (pulse detector)
221G timer
221H logic unit
222, 222(1), 222(2) driver
222H P-channel type MOS field-effect transistor
222L N-channel type MOS field-effect transistor
223 low voltage protection circuit
230 transformer chip (third chip)
230a first layer (lower layer)
230b second layer (upper layer)
231, 232, 233, 234 transformer
231p, 232p primary winding
231s, 232s secondary winding
C1, C2 capacitor
GND1, GND2 ground terminal
IN, IN1, IN2, INA, INB input terminal
N1 N-channel type MOS field-effect transistor
OUT, OUT1, OUT2 output terminal
R1 resistor
T11 to T18, T21 to T26, T31 to T36 terminal
VCC1, VCC2 power supply terminal
X21, X22, X23 internal terminal
Y21, Y22, Y23 wiring
Z21, Z22, Z23 via

The invention claimed is:

1. A pulse receiving circuit comprising:
a first pulse detector arranged to receive a differential input between a first reception pulse signal at a secondary winding of a first transformer and a second reception pulse signal at a secondary winding of a second transformer;
a second pulse detector arranged to receive the differential input between the first reception pulse signal and the second reception pulse signal with input polarity reversed to that of the first pulse detector;
a logic unit arranged to generate a reception pulse signal based on output signals of the first pulse detector and the second pulse detector;
a first switch and a second switch connected between both ends of the secondary windings of the first transformer and the second transformer, respectively; and
a timer to turn on the first switch and the second switch for a predetermined masking period from pulse detection timings of the first pulse detector and the second pulse detector, respectively.

2. The pulse receiving circuit according to claim 1, wherein the first pulse detector and the second pulse detector are each a comparator having an input offset.

3. The pulse receiving circuit according to claim 1, further comprising a first electrostatic protection element and a second electrostatic protection element connected between both ends of the secondary windings of the first transformer and the second transformer, respectively.

4. The pulse receiving circuit according to claim 1, wherein the logic unit sets the reception pulse signal to a first logic level according to the first reception pulse signal, and sets the reception pulse signal to a second logic level according to the second reception pulse signal.

5. A signal transmission device comprising:
a pulse transmission circuit arranged to generate a first transmission pulse signal and a second transmission pulse signal according to an input pulse signal;
a first transformer and a second transformer arranged to isolate between input and output and to respectively transmit the first transmission pulse signal and the second transmission pulse signal as a first reception pulse signal and a second reception pulse signal to poststage;
the pulse receiving circuit according to claim 1, arranged to generate the reception pulse signal according to the first reception pulse signal and the second reception pulse signal; and
a driver arranged to generate an output pulse signal according to the reception pulse signal.

6. The signal transmission device according to claim 5, wherein the pulse transmission circuit performs pulse drive of either one of the first transmission pulse signal and the second transmission pulse signal according to a logic level of the input pulse signal.

7. The signal transmission device according to claim 5, wherein
the pulse transmission circuit is integrated in a first chip,
the pulse receiving circuit and the driver are integrated in a second chip, and
the first transformer and the second transformer are integrated in a third chip.

8. The signal transmission device according to claim 7, wherein the third chip is provided with:
a first terminal connected to a first terminal of a primary winding forming the first transformer;
a second terminal connected to a second terminal of a primary winding forming the first transformer and a first terminal of a primary winding forming the second transformer;
a third terminal connected to a second terminal of a primary winding forming the second transformer;
a fourth terminal connected to a first terminal of a secondary winding forming the first transformer;
a fifth terminal connected to a second terminal of the secondary winding forming the first transformer and a first terminal of a secondary winding forming the second transformer; and
a sixth terminal connected to a second terminal of the secondary winding forming the second transformer.

9. The signal transmission device according to claim 5, comprising a plurality of sets of the first transformer and the second transformer.

10. A signal transmission device comprising:
a pulse transmission circuit arranged to generate a first transmission pulse signal and a second transmission pulse signal according to an input pulse signal;
a first transformer and a second transformer arranged to isolate between input and output and to respectively transmit the first transmission pulse signal and the second transmission pulse signal as a first reception pulse signal and a second reception pulse signal to poststage;
a pulse receiving circuit arranged to generate a reception pulse signal according to the first reception pulse signal and the second reception pulse signal; and
a driver arranged to generate an output pulse signal according to the reception pulse signal,
wherein the pulse receiving circuit comprises:
a first pulse detector arranged to receive a differential input between the first reception pulse signal at a secondary winding of the first transformer and the second reception pulse signal at a secondary winding of the second transformer;
a second pulse detector arranged to receive the differential input between the first reception pulse signal and the second reception pulse signal with input polarity reversed to that of the first pulse detector; and
a logic unit arranged to generate the reception pulse signal based on output signals of the first pulse detector and the second pulse detector.

\* \* \* \* \*